United States Patent
Merchant et al.

(10) Patent No.: US 11,769,797 B2
(45) Date of Patent: Sep. 26, 2023

(54) METHOD OF MAKING NANOSHEET FRINGE CAPACITORS OR MEMS SENSORS WITH DISSIMILAR ELECTRODE MATERIALS

(71) Applicant: NXP B.V., Eindhoven (NL)

(72) Inventors: Tushar Praful Merchant, Austin, TX (US); Mark Douglas Hall, Austin, TX (US); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 142 days.

(21) Appl. No.: 17/212,159

(22) Filed: Mar. 25, 2021

(65) Prior Publication Data
US 2022/0310786 A1  Sep. 29, 2022

(51) Int. Cl.
| | |
|---|---|
| *H01L 21/00* | (2006.01) |
| *H01L 29/06* | (2006.01) |
| *H01L 29/41* | (2006.01) |
| *H01L 49/02* | (2006.01) |
| *H01L 21/02* | (2006.01) |
| *H01L 29/78* | (2006.01) |

(52) U.S. Cl.
CPC ...... *H01L 29/0669* (2013.01); *H01L 21/0228* (2013.01); *H01L 21/0245* (2013.01); *H01L 21/02532* (2013.01); *H01L 28/60* (2013.01); *H01L 29/413* (2013.01); *H01L 29/7848* (2013.01)

(58) Field of Classification Search
CPC ........... H01L 21/02532; H01L 21/0245; H01L 29/0669; H01L 29/413
See application file for complete search history.

(56) References Cited

U.S. PATENT DOCUMENTS

| | | | |
|---|---|---|---|
| 9,653,480 B1 * | 5/2017 | Cheng | H01L 28/82 |
| 10,141,403 B1 | 11/2018 | Cheng et al. | |
| 10,269,920 B2 | 4/2019 | Cheng et al. | |
| 10,283,516 B1 | 5/2019 | Reznicek et al. | |
| 10,615,288 B1 | 4/2020 | Kong et al. | |
| 10,700,083 B1 | 6/2020 | Ramkumar et al. | |

(Continued)

OTHER PUBLICATIONS

A. Hubert et al., A stacked SONOS technology, up to 4 levels and 6nm crystalline nanowires, with gate-all-around or independent gates (φ-Flash), suitable for full 3D integration, IEEE, 2009.

(Continued)

*Primary Examiner* — Reema Patel

(57) ABSTRACT

A nanosheet semiconductor device and fabrication method are described for integrating the fabrication of nanosheet transistors (71) and capacitors/sensors (72) in a single nanosheet process flow by forming separate transistor and capacitor/sensor stacks (12A-16A, 12B-16B) which are selectively processed to form gate electrode structures (68A-C) which replace remnant SiGe sandwich layers in the transistor stack, to form silicon fixed electrodes using silicon nanosheets (13C, 15C) on a first side of the capacitor/sensor stack, and to form SiGe fixed electrodes using SiGe nanosheets (12C, 14C, 16C) from the middle of remnant SiGe sandwich layers in the capacitor/sensor stack (e.g., 16-2) which are separated from the silicon fixed electrodes by selectively removing top and bottom SiGe nanosheets (e.g., 16-1, 16-3) from the remnant SiGe sandwich layers in the capacitor/sensor stack.

13 Claims, 18 Drawing Sheets

(56) References Cited

U.S. PATENT DOCUMENTS

| | | | |
|---|---|---|---|
| 2018/0248021 A1 | 8/2018 | Bi et al. | |
| 2018/0277630 A1* | 9/2018 | Bi | H01L 25/072 |
| 2020/0083328 A1* | 3/2020 | Li | H01L 29/0673 |
| 2020/0083382 A1 | 3/2020 | Xu et al. | |
| 2020/0168715 A1 | 5/2020 | Wu et al. | |
| 2022/0274828 A1* | 9/2022 | Hall | B81C 1/00166 |

OTHER PUBLICATIONS

Wikipedia, Accelerometer, downloaded from the Internet Dec. 23, 2020.

Southwest Center for Microsystems Education (SCME), Microcantilever Applications Overview, Primary Knowledge, Participant Guide, Feb. 2017.

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009.

Semiconductor Engineering, Gate-All-Around FET (GAA FET), Nov. 12, 2019 https://semiengineering.com/knowledge_centers/integrated-circuit/transistors/3d/gate-all-around-fet/.

Peide Ye et al., The Nanosheet Transistor Is the Next (and Maybe Last) Step in Moore's Law, Nanosheet devices are scheduled for the 3-nanometer node as soon as 2021, IEEE Spectrum, Jul. 30, 2019.

Mark Lapedus, Semiconductor Engineering, What's After FinFETs?, Jul. 24, 2017.

Jaclyn K. Sprenger et al., Electron-enhanced atomic layer deposition of silicon thin films at room temperature, J. Vac. Sci. Technol. A, vol. 36, No. 1, Jan./Feb. 2018.

M. David Henry et al., Isotropic Plasma Etching of Ge, Si and SiNx Films, SAND2016-4884J, Aug. 31, 2016.

B. Hollander et al., Wet Chemical Etching of Si, Si1-xGex, and Ge in HF:H202:CH3COOH, Journal of the Electrochemical Society, 17 (6) H643-H646 (2010), published Apr. 23, 2010.

* cited by examiner

US 11,769,797 B2

1

METHOD OF MAKING NANOSHEET FRINGE CAPACITORS OR MEMS SENSORS WITH DISSIMILAR ELECTRODE MATERIALS

BACKGROUND OF THE INVENTION

Field of the Invention

The present invention is directed in general to the field of semiconductor devices. In one aspect, the present invention relates to integrated nanosheet devices and methods of fabricating same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1xnm nodes, but with next-generation technologies, stacked nanosheet transistors are in line to replace finFETs as the leading edge transistor architecture starting at the 3 nm node. However, existing semiconductor processes for fabricating nanosheet transistors typically use a separate fabrication process and/or dedicated dies to form MEMS sensors, such as Si cantilever capacitive sensors for acceleration and vibration detection. The additional processing steps with such conventional solutions increase the cost, size, and complexity of fabricating integrated circuit devices which include nanosheet transistors. The use of a separate die for the nanosheet transistors and MEMS sensors can increase the overall size of the integrated circuit devices, require additional wiring and connection costs, and reduce reliability of the more complex integrated circuit devices. Separately, capacitors with a very high capacitance density are needed for noise reduction, energy storage, and other purposes while minimizing any increase in die size. The additional processing steps for high-density capacitors and/or MEMS sensors can require new or special fabrication tools and/or materials that are not required for the nanosheet transistor fabrication, further adding to the fabrication costs.

As seen from the foregoing, the existing solutions for integrating the fabrication of nanosheet field effect transistor (FET) devices with high-density capacitors and/or MEMS sensors are extremely difficult at a practical level by virtue of the challenges with fabricating leading edge nanosheet transistors and high-density capacitors/MEMS sensors while meeting the performance requirements and cost constraints. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
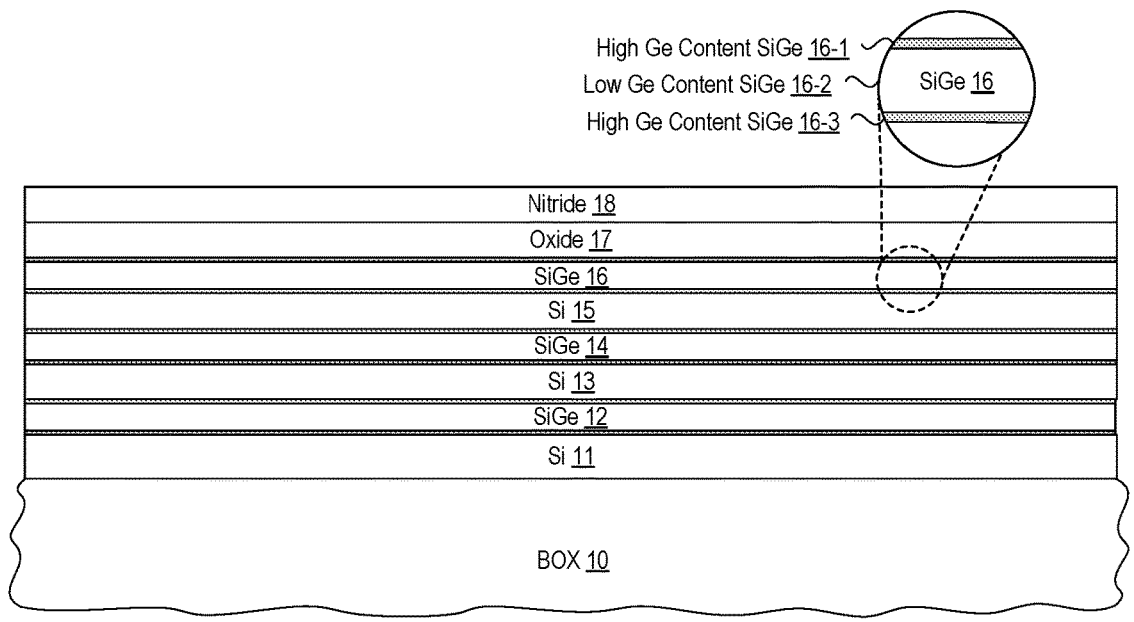
FIG. 1 is a partial cross-sectional view of a semiconductor structure including a Si/SiGe superlattice of alternating silicon nanosheets and silicon germanium tri-layer nanosheets with oxide and nitride cover layers formed over a substrate in accordance with selected embodiments of the present disclosure.

A nanosheet capacitor/sensor device and method are described for integrating the fabrication of nanosheet transistors with nanosheet high-density capacitors or MEMS sensors made with dissimilar electrode materials in a single nanosheet process flow, thereby providing a straightforward method for integrating capacitors and/or sensors with advanced nanosheet transistors on the same die with additional fabrication processing steps that are designed to have minimal effect on the nanosheet transistors. While specific implementation details are described herein with reference to one or more example embodiments, the present disclosure is directed to fabricating nanosheet capacitors or sensors while the nanosheet transistors are being fabricated to make dual use of as many process steps as possible. In some embodiments, all process steps used for fabricating the capacitors/sensors are standard process steps used for fabricating the nanosheet transistors, so no new fab tools or materials are needed. As an initial set of fabrication steps, a wafer substrate with a Si/SiGe superlattice structure of alternating silicon nanosheets and silicon germanium tri-layer nanosheets is patterned and etched to form a transistor stack and capacitor/sensor stack. With a first set of fabrication steps, the capacitor/sensor stack is masked and the transistor stack is processed to partially etch exposed SiGe tri-layer nanosheets and form recess openings in the Si/SiGe superlattice which are filled with inner nitride spacers to define remnant SiGe layers. With a second set of fabrication steps, a mask is applied to protect the transistor stack and a first side of the capacitor/sensor stack before partially etching exposed SiGe tri-layer nanosheets from the second side of the capacitor/sensor stack to form recess openings which are filled with first oxide spacers to define first remnant SiGe tri-layer nanosheets in the capacitor/sensor stack. With a third set of fabrication steps, an epitaxial source/drain region is formed on the second side of the capacitor/sensor stack. With a fourth set of fabrication steps, a mask is applied to protect the transistor stack and the second side of the capacitor/sensor stack before partially etching exposed SiGe tri-layer nanosheets from the first side of the capacitor/sensor stack to form recess openings which are filled with second oxide spacers to define second remnant SiGe tri-layer nanosheets in the capacitor/sensor stack. With a fifth set of fabrication steps, epitaxial source/drain regions are formed on the sides of the transistor stack and the first side of the capacitor/sensor stack. With a sixth set of fabrication steps, the capacitor/sensor stack is processed to remove high-germanium-content SiGe layers, thereby forming SiGe electrodes from remaining low-germanium-content SiGe nanosheets in the capacitor/sensor stack. With a seventh set of fabrication steps, the transistor stack is processed to remove remnant SiGe layers and to form SiGe gate etch openings which are filled with atomic layer deposition (ALD) oxide and metal layers to form a first set of transistor gate electrodes in the transistor stack. By forming the initial Si/SiGe superlattice structure to include alternating silicon nanosheets and silicon germanium tri-layer nanosheets, a high-density capacitor or MEMS sensor can be fabricated from the capacitor/sensor stack by exploiting differential etch properties of the silicon germanium tri-layer nanosheets to define a first set of fixed SiGe electrodes that are spaced apart from a second set of fixed Si electrodes, thereby creating a high-density capacitor (which can be referred to as a "fringe" capacitor due to the inter-digitated nature of the vertically-stacked electrodes) or a MEMS sensor that utilizes tunneling current differences between the SiGe and Si electrodes (or diaphragms) for acceleration and/or vibration sensing.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-35. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

Turning now to FIG. 1, a partial cross-sectional view illustrates a semiconductor structure including a Si/SiGe superlattice 11-16 which is formed over a buried oxide (BOX) or dielectric layer 10 and covered by an oxide layer 17 and nitride cover layer 18 in accordance with selected embodiments of the present disclosure. Though not shown, it will be appreciated that the semiconductor structure 10-18 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the Si/SiGe superlattice 11-16 on the base structure BOX layer 10, such as by epitaxially growing a plurality of nanosheet semiconductor layers of alternating silicon (Si) nanosheets 11, 13, 15 and silicon germanium (SiGe) tri-layer nanosheets 12, 14, 16. As shown, the Si/SiGe superlattice 11-16 is formed with alternating silicon nanosheets 11, 13, 15 and silicon germanium tri-layer nanosheets 12, 14, 16, where each SiGe tri-layer nanosheet stack (e.g., 16) is a sandwiched stack of a first high-germanium content SiGe layer (e.g., 16-1), a second low-germanium content SiGe layer (e.g., 16-2), and a third high-germanium content SiGe layer (e.g., 16-3). The relative thicknesses and material components of the individual layers in each SiGe sandwich stack 12, 14, 16 can be controlled as desired to achieve the final capacitors and/or sensors described hereinbelow. For example, the high-germanium content SiGe layers (e.g., 16-1, 16-3) may be formed with a predetermined thickness and material to allow for selective removal using an etch chemistry that is targeted to remove the high-germanium content SiGe layers (e.g., 16-1, 16-3) while leaving the low-germanium content SiGe layers (e.g., 16-2) in place. By controlling the thicknesses and materials used to form the high-germanium content SiGe layers (e.g., 16-1, 16-3) to allow for their selective removal with a control etch chemistry, the remaining low-germanium content SiGe layers (e.g., 16-2) may be separated from the adjacent silicon nanosheets (e.g., 15) by a gap or etch opening formed by removing the high-germanium content SiGe layers (e.g., 16-1, 16-3). While the Si/SiGe superlattice 11-16 is shown with three silicon nanosheets 11, 13, 15, it will be appreciated that the number of silicon nanosheets may be decreased or increased (e.g., 5 Si nanosheets instead of 3 Si nanosheets) to optimize transistor performance and capacitor/sensor device performance in parallel. If desired, the individual layers of the Si/SiGe superlattice 11-16 may be doped or implanted with impurities to control the conductivity of the Si/SiGe superlattice 11-16.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

After forming the Si/SiGe superlattice 11-16, a first insulator or dielectric layer 17 is formed, such as by depositing or otherwise forming a protective oxide layer 17 over the semiconductor substrate using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 20-200 Angstroms, though a thinner or thicker oxide layer may also be used. In addition, a second insulator or dielectric 18 is then formed on the protective oxide layer 17, such as by depositing or otherwise forming a protective nitride layer 18 to a predetermined thickness of approximately 20-200 Angstroms, though a thinner or thicker nitride layer may also be used. As will be appreciated, the unetched Si/SiGe superlattice 11-16 and cover layers 17, 18 are formed to cover the entire top surface of the buried oxide layer 10, including the intended nanosheet transistor and capacitor/sensor areas.

Figure 2:
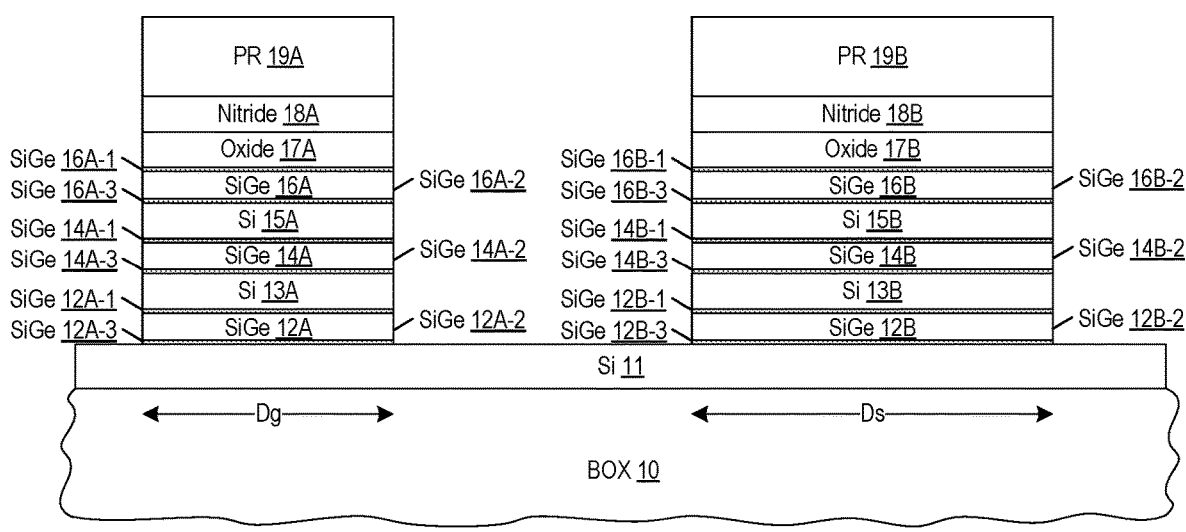
FIG. 2 illustrates processing subsequent to FIG. 1 after the Si/SiGe superlattice is patterned and etched to form a transistor stack and a capacitor/sensor stack.

FIG. 2 illustrates processing of the semiconductor structure subsequent to FIG. 1 after the Si/SiGe superlattice is patterned and etched to form a transistor stack and a capacitor/sensor stack. While any suitable pattern and etch process may be used, a first patterned photoresist (PR) mask 19A, 19B may be formed over the Si/SiGe superlattice 11-16 and over layers 17-18 by depositing, patterning, etching or developing a photoresist or hard mask layer on the nitride layer 18. With the patterned photoresist mask 19A, 19B in place, one or more etch processes are applied to create a transistor stack 12A-18A and capacitor/sensor stack 12B-18B. The etch processing can include using the patterned photoresist mask 19A, 19B to perform a sequence of reactive-ion etching (RIE) steps having suitable etch chemistry properties to remove, in sequence, the exposed portions of the protective nitride layer 18, protective oxide layer 17, and underlying layers of the Si/SiGe superlattice 11-16. The resulting transistor stack 12A-18A is defined by a first gate dimension Dg, and the capacitor/sensor stack 12B-18B is defined by a first sensor dimension Ds. As will be appreciated, the sidewalls of the transistor stack 12A-18A and capacitor/sensor stack 12B-18B are substantially vertical, though minor deviations in the sidewall profile may occur at each layer due to etch processing variations.

Figure 3:
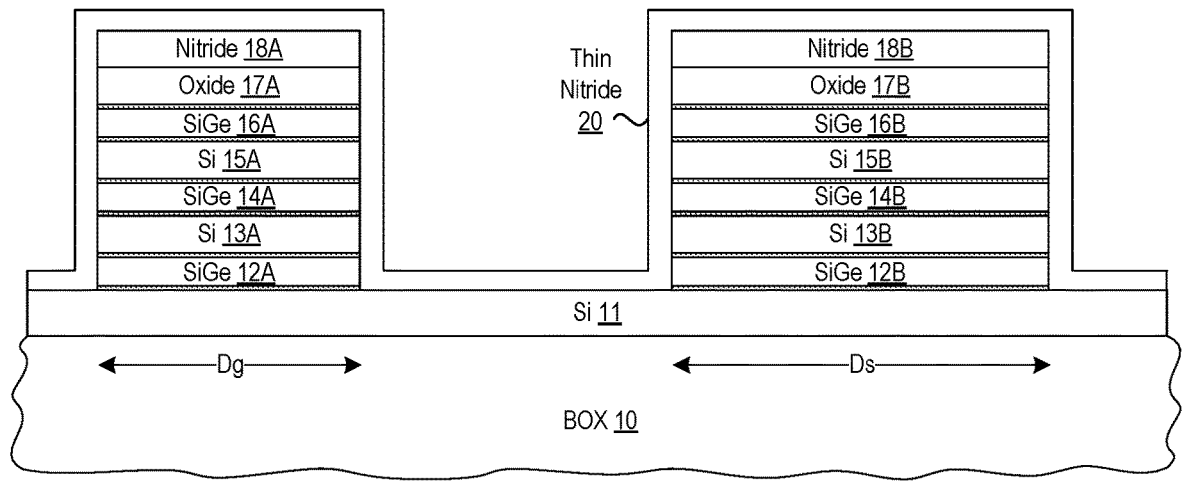
FIG. 3 illustrates processing subsequent to FIG. 2 after a first thin nitride layer is deposited over the transistor and capacitor/sensor stacks.

FIG. 3 illustrates processing of the semiconductor structure subsequent to FIG. 2 after a first mask layer 20 is formed over the transistor and capacitor/sensor stacks. In selected embodiments, the first mask layer 20 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The first mask layer 20 may be a different material from the underlying protective nitride layer 18 to facilitate selective etching and removal subsequently in the process. As will be appreciated, the first mask layer 20 may be formed as a substantially conformal layer of substantially uniform thickness, but this is not required in all embodiments.

Figure 4:
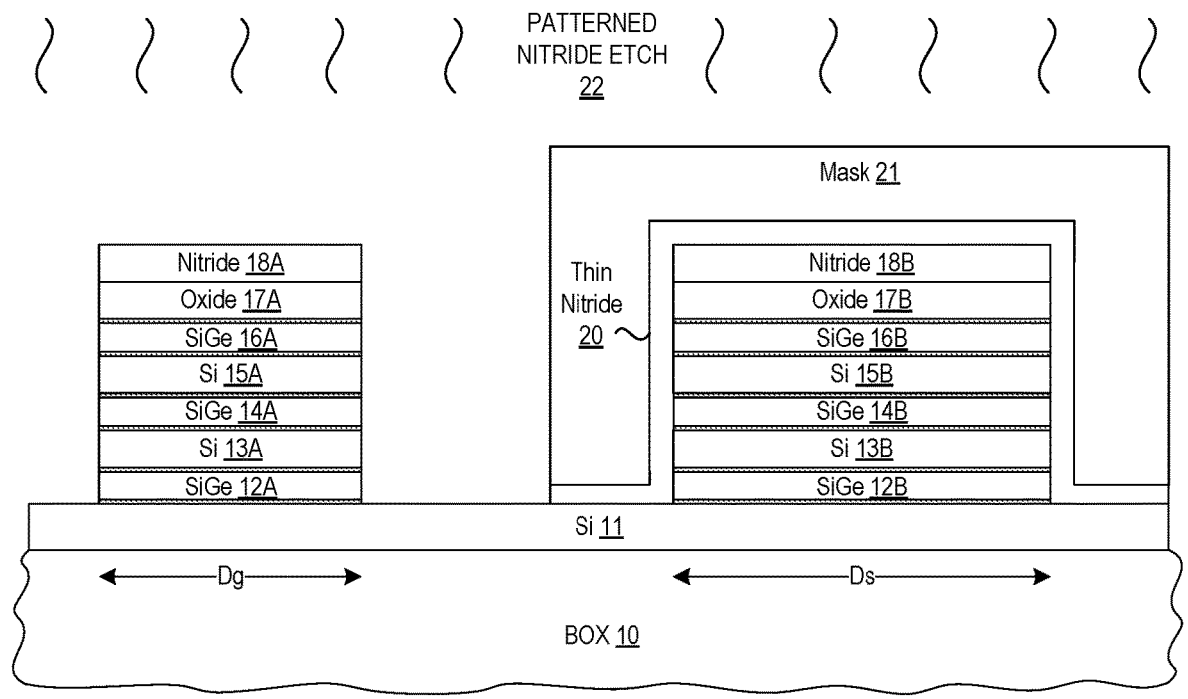
FIG. 4 illustrates processing subsequent to FIG. 3 after the first thin nitride layer is patterned and etched to form a first etch mask over the capacitor/sensor stack.

FIG. 4 illustrates processing of the semiconductor structure subsequent to FIG. 3 after the first thin nitride layer 20 is patterned and etched to form a first etch mask 20A over the capacitor/sensor stack 12B-18B. While any suitable pattern and etch process may be used, the first etch mask 20A may be formed by first depositing, patterning, etching or developing a photoresist or hard mask layer on the thin nitride layer 20 to form a patterned mask 21, and then applying a patterned nitride etch process 22 (e.g., RIE) with the patterned photoresist mask 21 in place to remove exposed portions of the first thin nitride layer 20, thereby exposing the transistor stack 12A-18A while leaving covered the capacitor/sensor stack 12B-18B.

Figure 5:
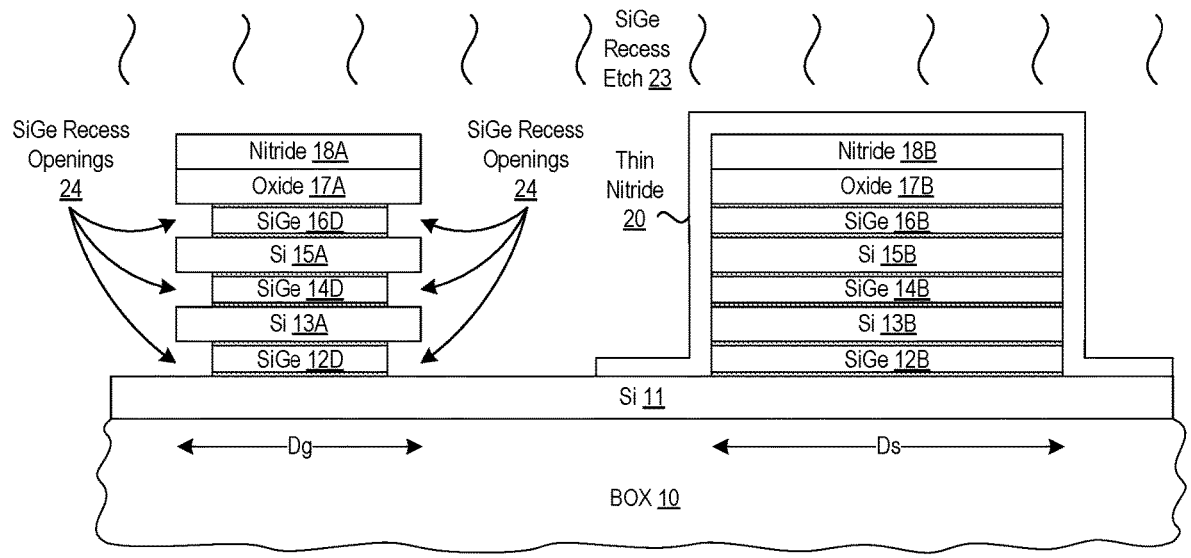
FIG. 5 illustrates processing subsequent to FIG. 4 after selectively recessing exposed silicon germanium tri-layer nanosheets to form recess openings on exposed sides of the transistor stack.

FIG. 5 illustrates processing of the semiconductor structure subsequent to FIG. 4 after selectively recessing exposed SiGe tri-layer nanosheets 12A, 14A, 16A to form recess openings 24 on the exposed sides of the transistor stack. At the depicted processing stage, the patterned mask 21 has been removed using any suitable stripping process, followed by application of a selective SiGe recess etch 23 to selectively and isotropically recess the SiGe tri-layer nanosheets on the exposed sides of the transistor stack 12A-18A. While any suitable SiGe etch process may be used, a controlled SiGe recess etch process 23, such as a timed isotropic dry etch, may be used to remove a peripheral portion of each sandwiched stack of SiGe tri-layer nanosheets (e.g., 16-1, 16-2, 16-3) from the exposed exterior sides of the transistor stack 12A-18A. For example, a dry etch process may isotropically etch the SiGe tri-layer nanosheets selective to silicon, such as by employing isotropic plasma etching process to selectively recess the SiGe layers as described in M. D. Henry et al., "Isotropic Plasma Etching of Ge, Si and $SiN_x$ Films," Journal of Vacuum Science and Technology, vol. 34, Issue 5 (Aug. 31, 2016) (https://www.osti.gov/servlets/purl/1323884). Alternatively, a wet etch process may isotropically etch the high-germanium content SiGe selective to low-germanium content SiGe and pure silicon, such as by employing a wet etch chemistry of HF, hydrogen peroxide, and acetic acid as described in B. Hollander et al, "Wet Chemical Etching of Si, $Si_{1-x}Ge_x$, and Ge in $HF:H_2O_2$: $CH_3COOH$," Journal of The Electrochemical Society, Vol. 157, No, 6, pp. H643-H646 (Apr. 23, 2010) (https://www.researchgate.net/profile/Dan-Buca/publication/235942380_Wet_Chemical_Etching_of_Si_Si1–xGex_and_Ge_in_HFH2O2CH3COOH/links/55b7a09b08aed621de047364/Wet-Chemical-Etching-of-Si-Si1–xGex-and-Ge-in-HFH2O2CH3COOH.pdf). As will be appreciated, the etch chemistries of both of these SiGe etches can be adjusted to selectively recess the SiGe tri-layer nanosheet layers 12A, 14A, 16A. At the conclusion of the etching process, the remnant SiGe tri-layer nanosheet portions 12D, 14D, 16D of the transistor stack remain where the recess openings 24 have not been formed. As will be appreciated, the etched sidewall edges of the remnant SiGe tri-layer nanosheets 12D, 14D, 16D may have a substantially vertical or slightly curved profile resulting from the selective SiGe recess etch 23.

Figure 6:
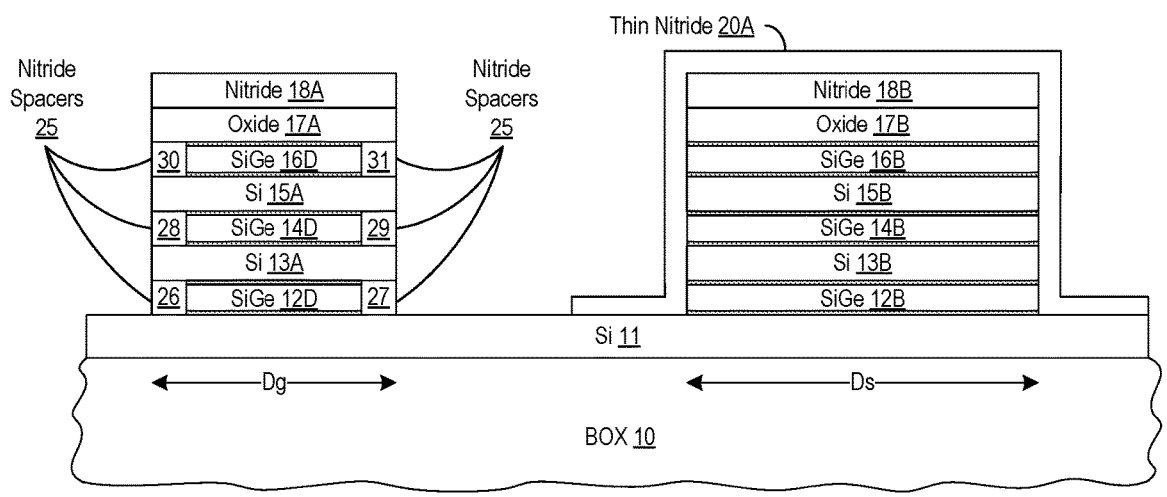
FIG. 6 illustrates processing subsequent to FIG. 5 after forming first inner nitride spacers to fill the recess openings on the exposed sides of the transistor stack.

FIG. 6 illustrates processing of the semiconductor structure subsequent to FIG. 5 after forming first inner nitride spacers 25 to fill the recess openings 24 on the exposed sides of the transistor stack. While any suitable spacer formation sequence may be used, the inner nitride spacers 25 may be formed by depositing one or more nitride layers over the semiconductor structure, and then applying an isotropic etch process to remove the nitride layer(s) from the top and sides of the transistor stack but leaving remnant nitride spacers 25 in the recess openings at the exposed sides of the transistor stack. For example, an inner nitride layer may be deposited over the semiconductor structure to a predetermined thickness that is sufficient to cover at least the transistor stack and fill the recess openings on the exposed sides thereof. By applying an isotropic nitride etch process (e.g., RIE) to remove the inner nitride layer from the top and sides of the transistor stack, the unetched nitride layer(s) 26-31 form inner nitride spacers 25 on the transistor stack. As will be appreciated, the material used to form the inner nitride spacers 25 should have a different stoichiometry from the materials used to form the nitride layers 18A, 18B, and 20A so they are only slightly affected or removed during the formation of the sidewall spacers 25. In addition, the protective nitride layer 18A, 18B should be thick enough to withstand the various silicon nitride etches for the whole process. As will be appreciated, the etched sidewall edges of the first inner nitride spacers 25 may have a substantially vertical or slightly curved profile resulting from the applied isotropic nitride etch process.

Figure 7:
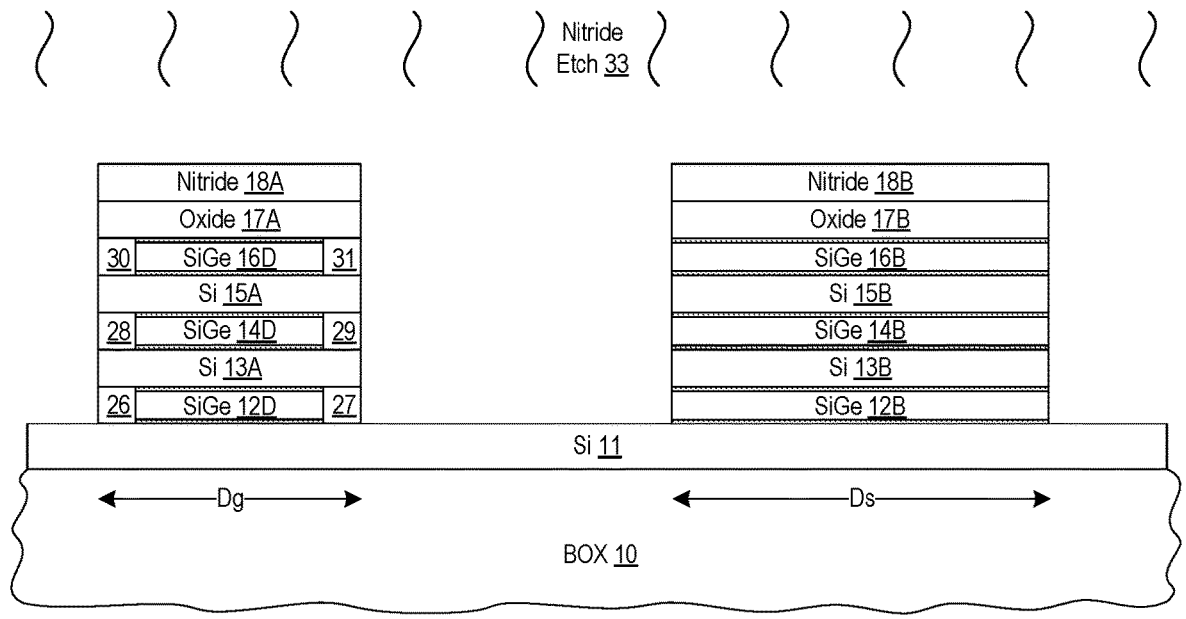
FIG. 7 illustrates processing subsequent to FIG. 6 after removing the first etch mask from the capacitor/sensor stack.

FIG. 7 illustrates processing of the semiconductor structure subsequent to FIG. 6 after removing the first etch mask 20A from the capacitor/sensor stack. While any suitable etch process may be used, the first etch mask 20A may be etched with an isotropic nitride etch process 33 to remove or strip the patterned thin nitride layer 20A, leaving the transistor and capacitor/sensor stacks exposed. As will be appreciated, the nitride etch process 33 may etch partially into any exposed portion of the underlying nitride layers 18A, 18B and/or remnant nitride spacers 25. In addition or in the alternative, the underlying nitride layers 18A, 18B and/or remnant nitride spacers 25 may be formed with different stoichiometries of silicon-rich nitride which resist the nitride etch process 33.

Figure 8:
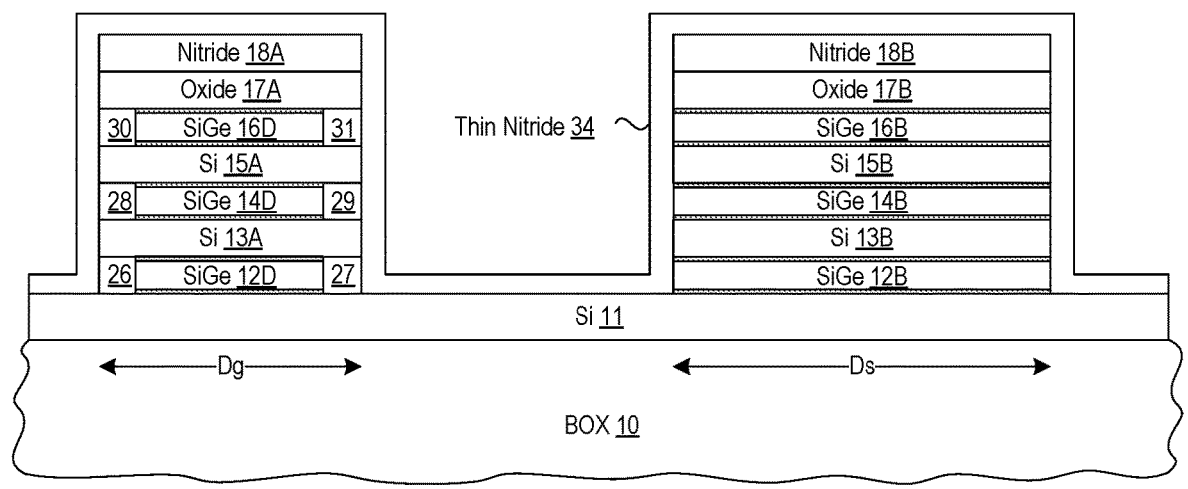
FIG. 8 illustrates processing subsequent to FIG. 7 after a second thin nitride layer is deposited over the transistor and capacitor/sensor stacks.

FIG. 8 illustrates processing of the semiconductor structure subsequent to FIG. 7 after a second mask layer 34 is deposited over the transistor and capacitor/sensor stacks. In selected embodiments, the second mask layer 34 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The second mask layer 34 may be a different material from the underlying protective nitride layer 18A, 18B to facilitate selective etching and removal subsequently in the process. As will be appreciated, the second mask layer 20 may be formed as a substantially conformal layer of substantially uniform thickness, but this is not required in all embodiments.

Figure 9:
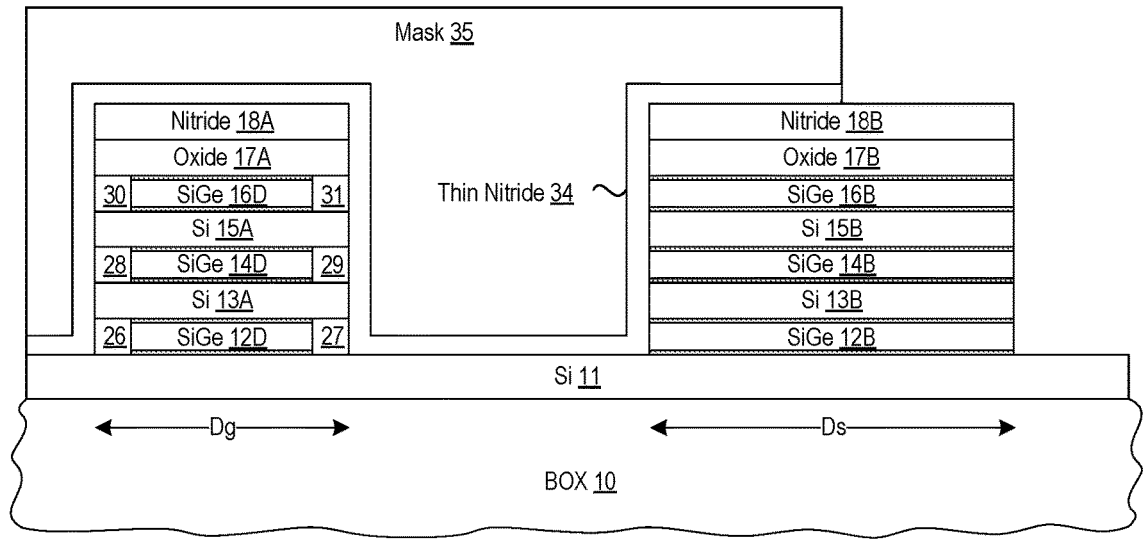
FIG. 9 illustrates processing subsequent to FIG. 8 after the second thin nitride layer is patterned and etched to form a second etch mask over the transistor stack and a first side of the capacitor/sensor stack.

FIG. 9 illustrates processing of the semiconductor structure subsequent to FIG. 8 after the second mask layer 34 is patterned and etched to form a second etch mask 34A over the transistor stack and a first side of the capacitor/sensor stack 12B-18B. While any suitable pattern and etch process may be used, the second etch mask 34A may be formed by first depositing, patterning, etching or developing a photoresist or hard mask layer on the second thin nitride layer 34 to form a patterned mask 35, and then applying a nitride etch process (e.g., RIE) with the patterned photoresist mask 35 in place to remove exposed portions of the second thin nitride layer 34, thereby exposing the second side of the capacitor/sensor stack while leaving covered the transistor stack and the first side of the capacitor/sensor stack.

Figure 10:
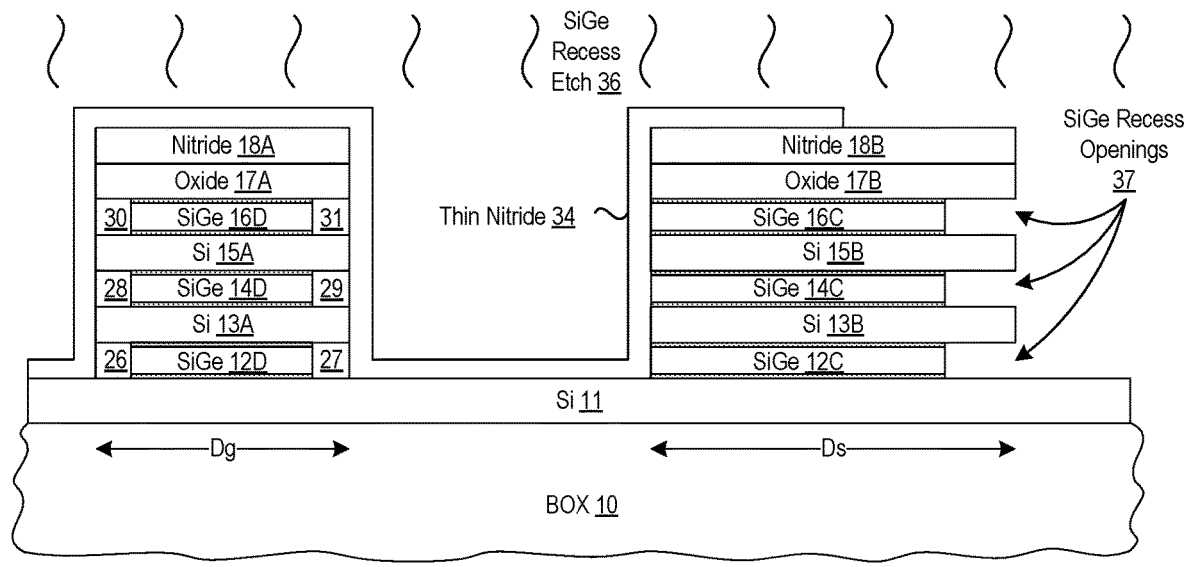
FIG. 10 illustrates processing subsequent to FIG. 9 after selectively recessing exposed silicon germanium tri-layer nanosheets to form recess openings on the second exposed side of the capacitor/sensor stack.

FIG. 10 illustrates processing of the semiconductor structure subsequent to FIG. 9 after selectively recessing exposed SiGe tri-layer nanosheets to form recess openings 37 on the second exposed side of the capacitor/sensor stack. At the depicted processing stage, the patterned mask 35 has been removed using any suitable stripping process, followed by application of a selective SiGe recess etch 36 to selectively and isotropically recess the SiGe tri-layer nanosheets 12B, 14B, 16B on the exposed second exterior side of the capacitor/sensor stack. While any suitable SiGe etch process may be used, a controlled SiGe recess etch process 36, such as a timed isotropic dry or wet etch similar to the selective SiGe recess etch 23 described hereinabove, may be used to remove a peripheral portion of each sandwiched stack of SiGe tri-layer nanosheets (e.g., 16-1, 16-2, 16-3) from the exposed second exterior side of the capacitor/sensor stack. At the conclusion of the etching process 36, the remnant SiGe tri-layer nanosheet portions 12C, 14C, 16C of the capacitor/sensor stack remain where the recess openings 37 have not been formed. As will be appreciated, the etched sidewall edges of the remnant SiGe tri-layer nanosheets 12C, 14C, 16C may have a substantially vertical or slightly curved profile resulting from the selective SiGe recess etch 36. In embodiments where the selective SiGe recess etch 36 etches the SiGe tri-layer nanosheets 12B, 14B, 16B from the exposed side of the capacitor/sensor stack, the positioning of the sidewall edge of the patterned photoresist mask 35 and patterned nitride 34A will be controlled to place the sidewall of the remnant SiGe tri-layer nanosheets 12C, 14C, 16C in the desired final position.

Figure 11:
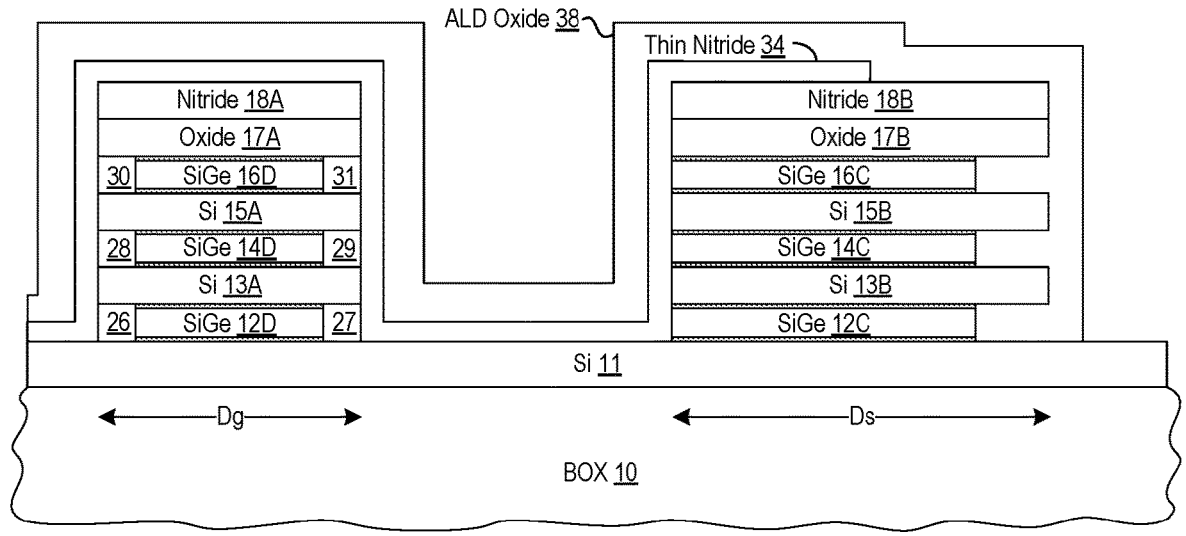
FIG. 11 illustrates processing subsequent to FIG. 10 after an atomic layer deposition (ALD) oxide layer is deposited over the transistor and capacitor/sensor stacks to fill recess openings on the second exposed side of the capacitor/sensor stack.

FIG. 11 illustrates processing of the semiconductor structure subsequent to FIG. 10 after a conformal dielectric layer 38 is formed over the transistor and capacitor/sensor stacks to fill recess openings 37 on the second exposed side of the capacitor/sensor stack. In selected embodiments, the conformal dielectric layer 38 is formed with an atomic layer deposition (ALD) process to conformally deposit an ALD oxide layer 38 to a thickness of approximately 5-100 Angstroms, though a thinner or thicker ALD oxide layer may also be used. However, the thickness of the ALD oxide layer 38 should be sufficient to completely fill the SiGe recess openings 37 on the exposed second side of the capacitor/sensor stack. In selected embodiments, the ALD oxide deposition process may be implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. During these surface reactions and the layer by layer growth cycle, the ALD process exhibits some important properties for nanofabrication: excellent conformality, atomic scale thickness control, and low growth temperature. As a result, the ALD oxide deposition process offers accurate control of film thickness and composition as well as the ability to achieve excellent uniformity over large areas at relatively low temperatures. The resulting ALD oxide 38 may be formed as a substantially conformal layer to have a substantially vertical sidewall on the second exterior side of the capacitor/sensor stack, though the profile of the ALD oxide layer 38 may follow the contour of the underlying layer(s).

Figure 12:
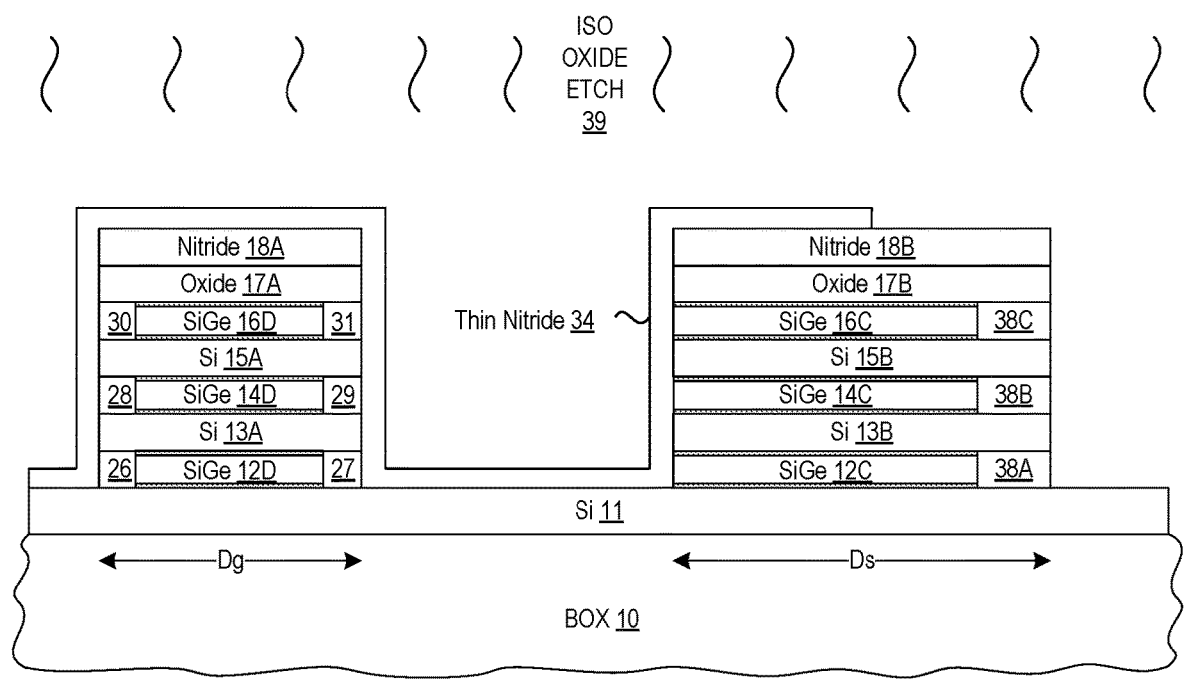
FIG. 12 illustrates processing subsequent to FIG. 11 after performing an isotropic oxide etch to leave ALD oxide layers on the exposed second side of the capacitor/sensor stack.

FIG. 12 illustrates processing of the semiconductor structure subsequent to FIG. 11 after performing an isotropic oxide etch 39 to leave ALD oxide layers 38A-C on the exposed second side of the capacitor/sensor stack. While any suitable etch process may be used, the ALD oxide layer 38 may be etched with an isotropic oxide etch process 39 to remove the ALD oxide layer 38, leaving only remnant ALD oxide layers 38A-C that fill the cavities left by the SiGe recess etch at the exposed second exterior side of the capacitor/sensor stack. As will be appreciated, the etched sidewall edges of the remnant ALD oxide layers 38A-C may have a substantially vertical or slightly curved profile resulting from the isotropic oxide etch 39.

Figure 13:
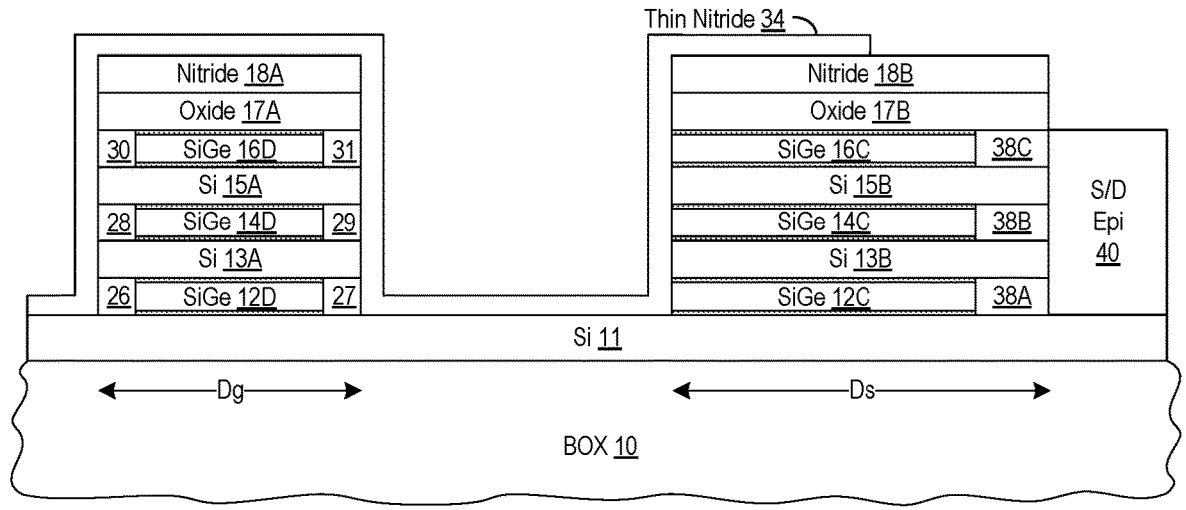
FIG. 13 illustrates processing subsequent to FIG. 12 after epitaxially growing and doping or implanting a source/drain region adjacent to the second exposed side of the capacitor/sensor stack.

FIG. 13 illustrates processing of the semiconductor structure subsequent to FIG. 12 after epitaxially growing and doping or implanting a source/drain region 40 adjacent to the second exposed side of the capacitor/sensor stack. While any suitable source/drain fabrication sequence may be used, the source/drain regions 40 may be formed with the second etch mask 34A in place by using the exposed portion of the silicon layer 11 to epitaxially grow or deposit a semiconductor layer (e.g., silicon) in the region adjacent to the second exposed side of the capacitor/sensor stack. As will be appreciated, the epitaxial silicon deposition or growth process forms the epitaxial source/drain regions 40 from the seed semiconductor layer 11 and any exposed silicon layers 13B, 15B. At this point, the epitaxial source/drain regions 40 can be doped using any suitable doping technique. For example, the epitaxial source/drain regions may be in-situ doped during the epi process, such as by doping the epitaxially grown source/drain features with boron, arsenic and/or phosphorus to form doped epitaxial source/drain regions 40. In some embodiments, the source/drain features are not in-situ doped, and instead an implantation process is performed to dope the epitaxial source/drain regions 40. In some embodiments, after formation of the source/drain regions 40, an epi anneal process may be performed to promote formation of crystalline structures in the epitaxial source/drain regions 40, such as by applying a high thermal budget process. At a later stage in the process flow, one or more etch or polish steps may be applied to planarize the top surface of the epitaxial source/drain regions 40.

Figure 14:
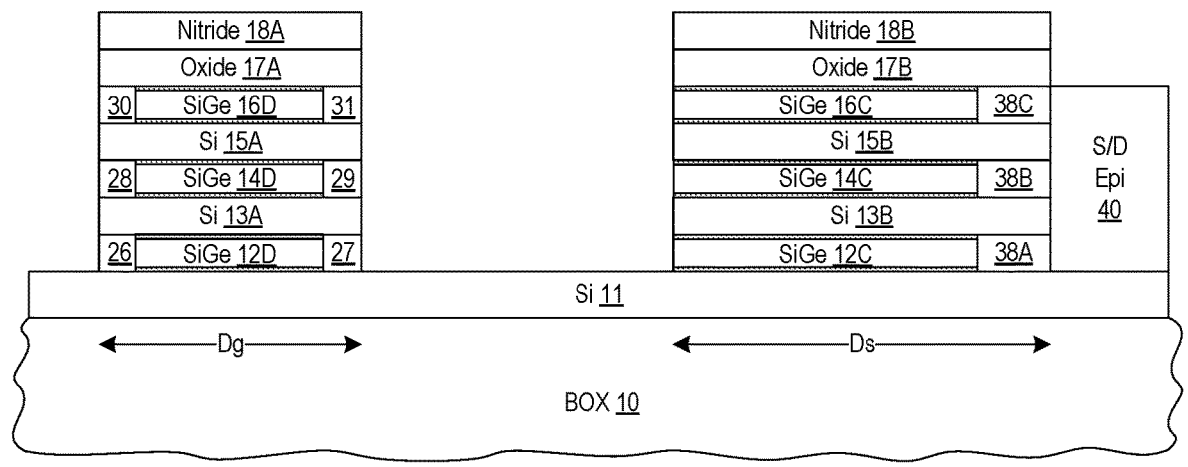
FIG. 14 illustrates processing subsequent to FIG. 13 after removing the second etch mask from the transistor stack and first side of the capacitor/sensor stack.

FIG. 14 illustrates processing of the semiconductor structure subsequent to FIG. 13 after removing the second etch mask 34A from the transistor stack and first side of the capacitor/sensor stack. While any suitable etch process may be used, the second etch mask 34A may be etched with an isotropic nitride etch process 41 to remove or strip the patterned thin nitride layer 34A, leaving the transistor and capacitor/sensor stacks exposed. As will be appreciated, the nitride etch process 41 may etch partially into any exposed portion of the underlying nitride layer 18A, 18B and/or remnant nitride spacers 26-31. In addition or in the alternative, the underlying nitride layers 18A, 18B and/or remnant nitride spacers 26-31 may be formed with different stoichiometries of silicon-rich nitride which resist the nitride etch process 41.

Figure 15:
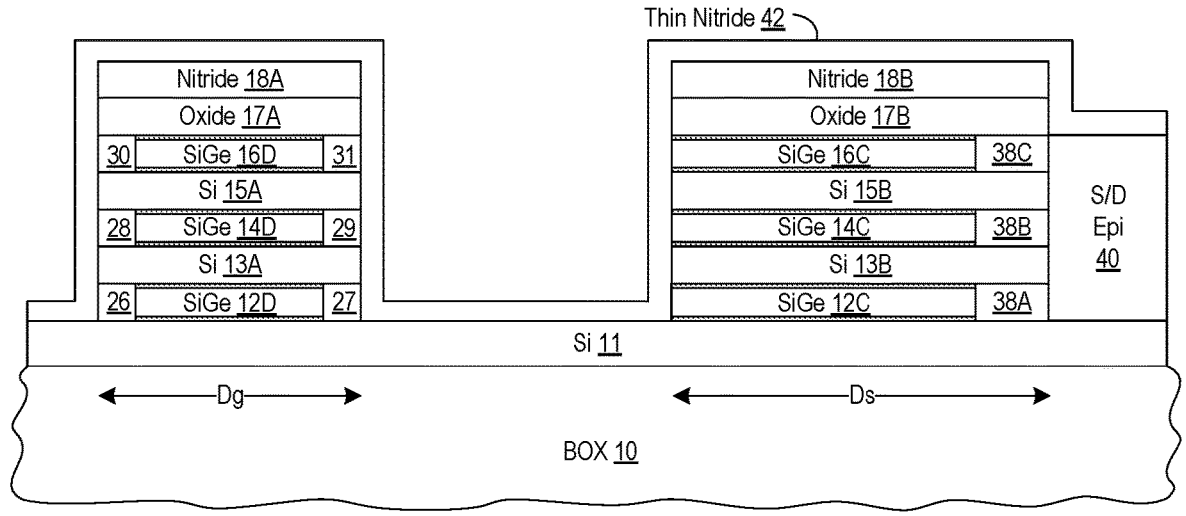
FIG. 15 illustrates processing subsequent to FIG. 14 after a third thin nitride layer is deposited over the transistor and capacitor/sensor stacks.

FIG. 15 illustrates processing of the semiconductor structure subsequent to FIG. 14 after a third mask layer 42 is deposited over the transistor and capacitor/sensor stacks. In selected embodiments, the third mask layer 42 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The third mask layer 42 may be a different material from the underlying protective nitride layer 18A, 18B to facilitate selective etching and removal subsequently in the process. As will be appreciated, the third mask layer 42 may be formed as a substantially conformal layer of substantially uniform thickness, but this is not required in all embodiments.

Figure 16:
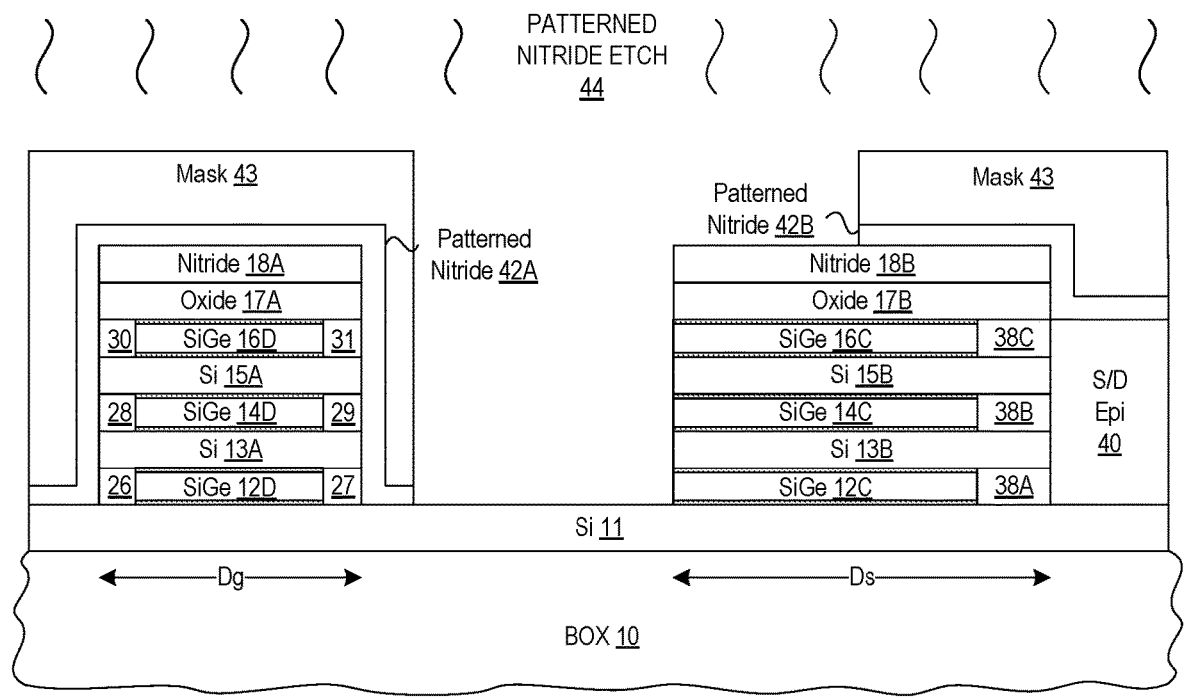
FIG. 16 illustrates processing subsequent to FIG. 15 after the third thin nitride layer is patterned and etched to form a third etch mask over the transistor stack and the second side of the capacitor/sensor stack.

FIG. 16 illustrates processing of the semiconductor structure subsequent to FIG. 15 after the third mask layer 42 is patterned and etched to form a third etch mask 42A, 42B over the transistor stack and the second side of the capacitor/sensor stack. While any suitable pattern and etch process may be used, the third etch mask 42A, 42B may be formed by first depositing, patterning, etching or developing a photoresist or hard mask layer on the third thin nitride layer 42 to form a patterned mask 43, and then applying a nitride etch process 44 (e.g., RIE) with the patterned photoresist mask 43 in place to remove exposed portions of the third thin nitride layer 42, thereby exposing the first side of the capacitor/sensor stack while leaving covered the transistor stack and the second side of the capacitor/sensor stack.

Figure 17:
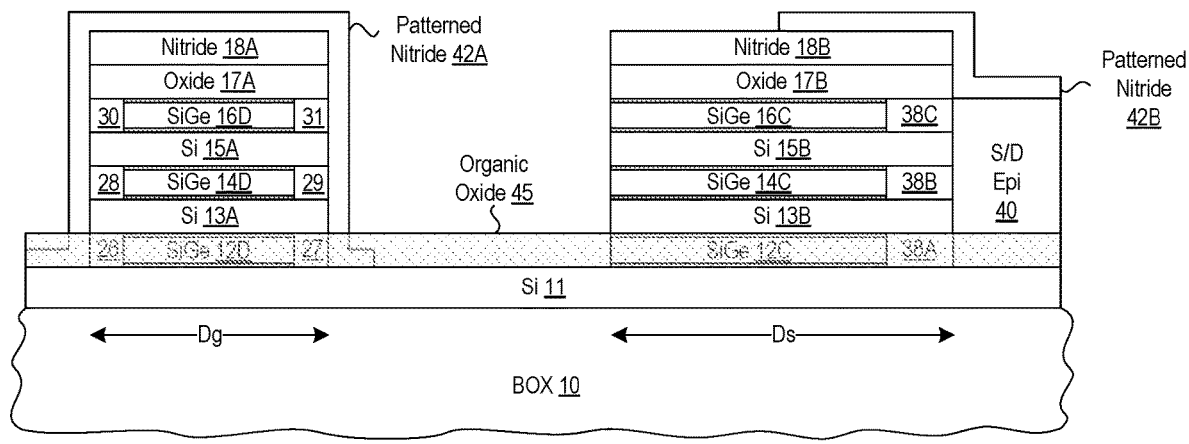
FIG. 17 illustrates processing subsequent to FIG. 16 after forming a first organic oxide layer over the substrate to protect the bottom silicon nanosheet in the stacked Si/SiGe superlattice from subsequent processing.

FIG. 17 illustrates processing of the semiconductor structure subsequent to FIG. 16 after forming a first organic oxide layer 45 or other suitable protective structure over the substrate to protect the bottom silicon layer 11 in the transistor and capacitor/sensor stacks from subsequent processing. At the depicted processing stage, the patterned mask 43 has been removed using any suitable stripping process, followed by deposition of the first organic oxide layer 45 using any suitable process. In selected embodiments, the first organic oxide layer 45 may be formed with a deposition process where a layer of organic oxide is spun on like resist to flow into the low regions of the semiconductor structure. By controlling the amount of organic oxide layer 45 that is deposited to fill up to the first SiGe tri-layer nanosheet 12C, 12D, the first organic oxide layer 45 covers or protects the bottom silicon layer 11 from subsequent silicon etch processing.

Figure 18:
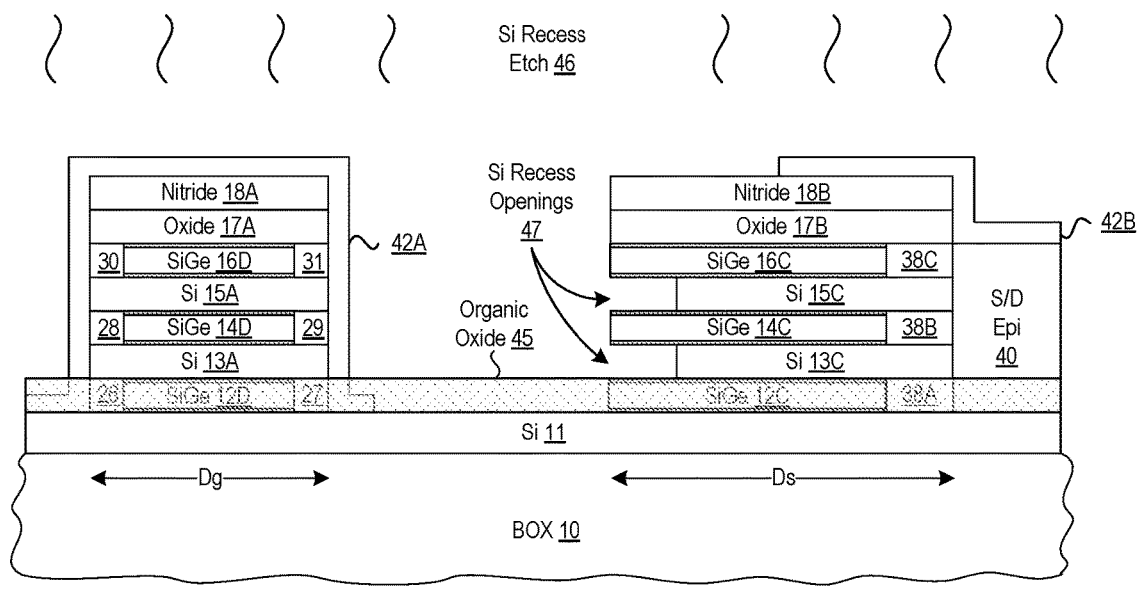
FIG. 18 illustrates processing subsequent to FIG. 17 after selectively recessing exposed silicon nanosheets to form recess openings on the first exposed side of the capacitor/sensor stack.

FIG. 18 illustrates processing of the semiconductor structure subsequent to FIG. 17 after applying a silicon recess etch 46 to selectively recess exposed silicon nanosheets and form silicon recess openings 47 on the first exposed side of the capacitor/sensor stack. While any suitable silicon etch process may be used, a controlled silicon recess etch process 46, such as a timed isotropic dry or wet etch similar to the selective SiGe recess etch 23 described hereinabove, may be used to remove a peripheral portion of the exposed silicon nanosheets (e.g., 13B, 15B) from the exposed first interior side of the capacitor/sensor stack. At the conclusion of the etching process 46, the remnant silicon nanosheet portions 13C, 15C of the capacitor/sensor stack remain where the recess openings 47 have not been formed. As will be appreciated, the etched sidewall edges of the remnant silicon nanosheets 13C, 15C may have a substantially vertical or slightly curved profile resulting from the selective silicon recess etch 46. In embodiments where the selective silicon recess etch 46 etches the silicon nanosheets 13B, 15B from the exposed side of the capacitor/sensor stack, the positioning of the sidewall edge of the patterned photoresist mask 43 and patterned etch mask 42B will be controlled to place the sidewall of the remnant silicon nanosheets 13C, 15C in the desired final position.

Figure 19:
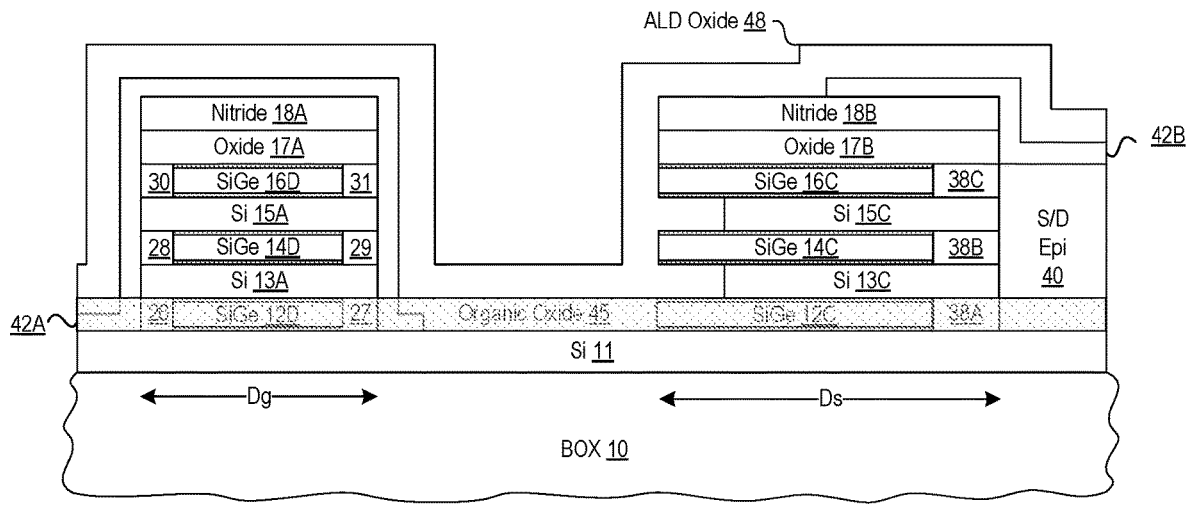
FIG. 19 illustrates processing subsequent to FIG. 18 after an atomic layer deposition (ALD) oxide layer is deposited over the transistor and capacitor/sensor stacks to fill recess openings on the first exposed side of the capacitor/sensor stack.

FIG. 19 illustrates processing of the semiconductor structure subsequent to FIG. 18 after a conformal dielectric layer 48 is formed over the transistor and capacitor/sensor stacks to fill the silicon recess openings 47 on the second exposed side of the capacitor/sensor stack, such as by depositing an ALD oxide layer 48 to a predetermined thickness that is sufficient to fill the silicon recess openings 47. The resulting ALD oxide layer 48 may be formed as a substantially conformal layer having a substantially vertical sidewall on the first interior side of the capacitor/sensor stack, though the profile of the ALD oxide layer 48 may follow the contour of the underlying layer(s).

Figure 20:
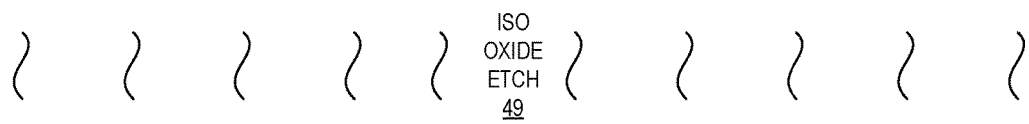
FIG. 20 illustrates processing subsequent to FIG. 19 after performing an isotropic oxide etch to leave ALD oxide layers on the first exposed side of the capacitor/sensor stack.
Figure 20:
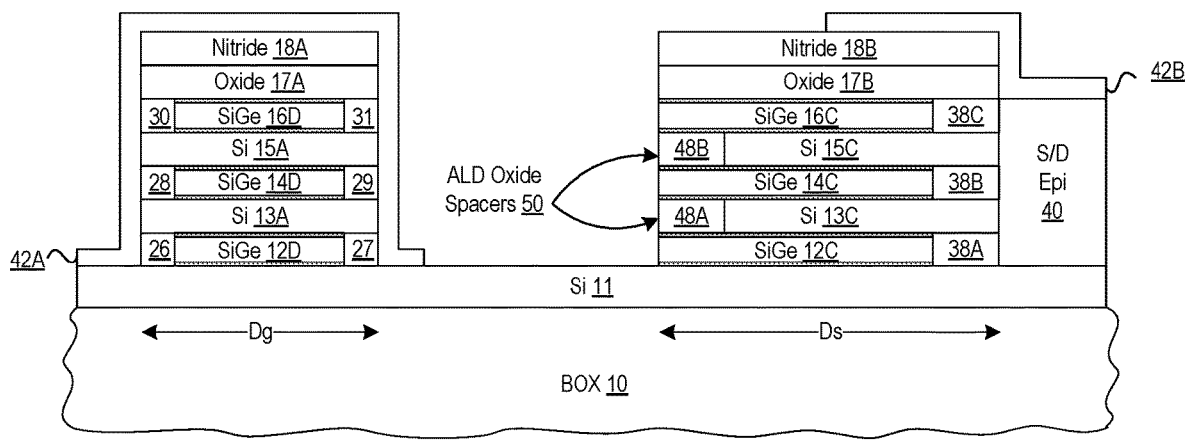

FIG. 20 illustrates processing of the semiconductor structure subsequent to FIG. 19 after performing an isotropic oxide etch 49 to leave ALD oxide layers 48A-B which form ALD oxide spacers 50 on the exposed first interior side of the capacitor/sensor stack. With the patterned etch masks 42A, 42B protecting the transistor stack and second exterior side of the capacitor/sensor stack, the isotropic oxide etch 49 removes the ALD oxide layer 48 from the patterned etch masks 42A, 42B and from the first exposed interior side of the capacitor/sensor stack, leaving only ALD oxide layers 48A-B to form ALD oxide spacers 50 on the first exposed interior side of the capacitor/sensor stack. As will be appreciated, the etched sidewall edges of the remnant ALD oxide layers 48A-B may have a substantially vertical or slightly curved profile resulting from the isotropic oxide etch 49.

Figure 21:
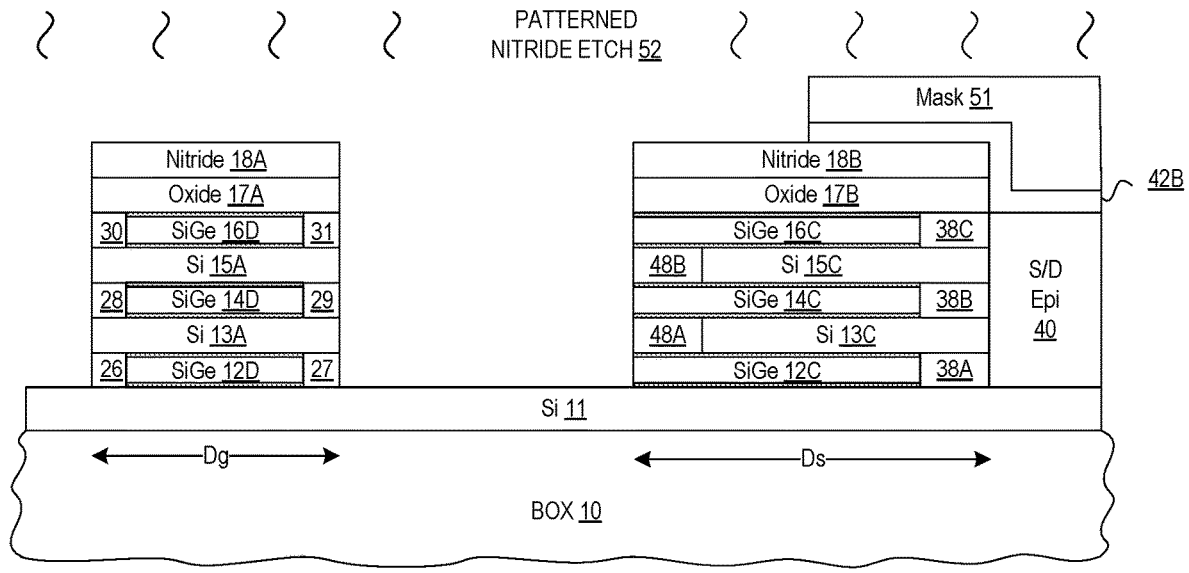
FIG. 21 illustrates processing subsequent to FIG. 20 after performing a patterned nitride etch to remove the third etch mask from the transistor stack but not the second side of the capacitor/sensor stack.

FIG. 21 illustrates processing of the semiconductor structure subsequent to FIG. 20 after performing a patterned nitride etch 52 to remove the third etch mask 42A from the transistor stack but not the third etch mask 42B from the second exterior side of the capacitor/sensor stack. While any suitable pattern and etch process may be used, the patterned nitride etch 52 may be performed by first depositing, patterning, etching or developing a photoresist or hard mask layer on the third etch mask 42B to form a patterned mask 51, and then applying a nitride etch process 52 (e.g., RIE) with the patterned photoresist mask 51 in place to remove exposed portions of the third etch mask 42A, thereby exposing the transistor stack and the first interior side of the capacitor/sensor stack while leaving covered the second exterior side of the capacitor/sensor stack.

Figure 22:
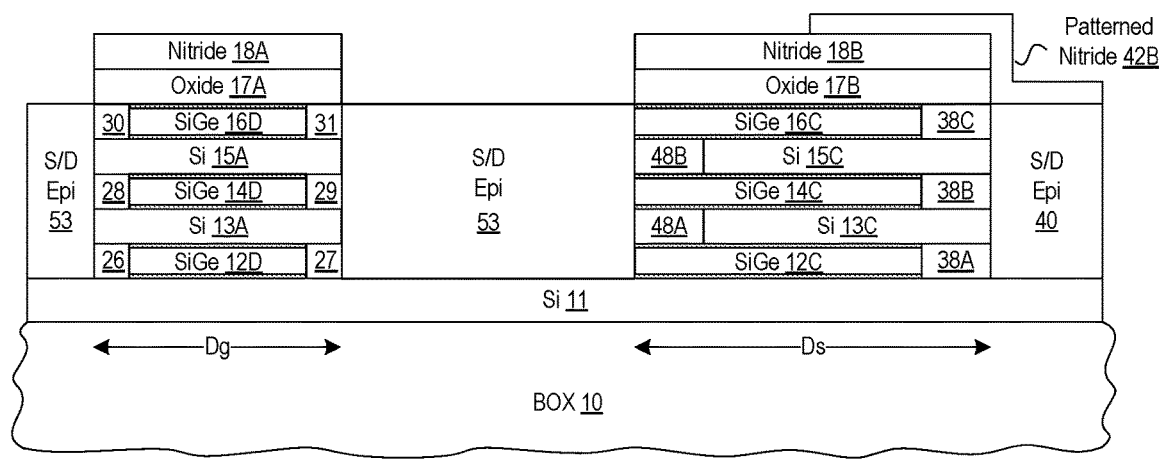
FIG. 22 illustrates processing subsequent to FIG. 21 after epitaxially growing and doping or implanting source/drain regions adjacent to the transistor stack and the first exposed side of the capacitor/sensor stack.

FIG. 22 illustrates processing of the semiconductor structure subsequent to FIG. 21 after epitaxially growing and doping or implanting source/drain regions 53 adjacent to the transistor stack and the first side of the capacitor/sensor stack. While any suitable source/drain fabrication sequence may be used, the source/drain regions 53 may be formed with the third etch mask 42B by using the exposed portion of the silicon layer 11 to epitaxially grow or deposit a semiconductor layer (e.g., silicon) 53 in the regions between and adjacent to the transistor and capacitor/sensor stacks. As will be appreciated, the epitaxial silicon deposition or growth process forms the epitaxial source/drain regions 53 from the seed semiconductor layer 11 and any exposed silicon layers 13A, 15A. At this point, the epitaxial source/drain regions 53 can be doped using any suitable doping technique, such as performing in-situ doping during the epi process or using an implantation process. As will be appreciated, the doping dose used to dope the epitaxial source/drain regions 53 is greater than a doping dose (if any) used to dope the channel regions in the silicon layers 11, 13A, 15A. In addition, separate processing of the source/drain regions 53 may be performed in separate processing sequences for each of N-type and P-type source/drain features. In some embodiments, after formation of the source/drain regions 53, an epi anneal process may be performed to promote formation of crystalline structures in the epitaxial source/drain regions 53, such as by applying a high thermal budget process. At a later stage in the process flow, one or more etch or polish steps may be applied to planarize the top surface of the epitaxial source/drain regions 53.

Figure 23:
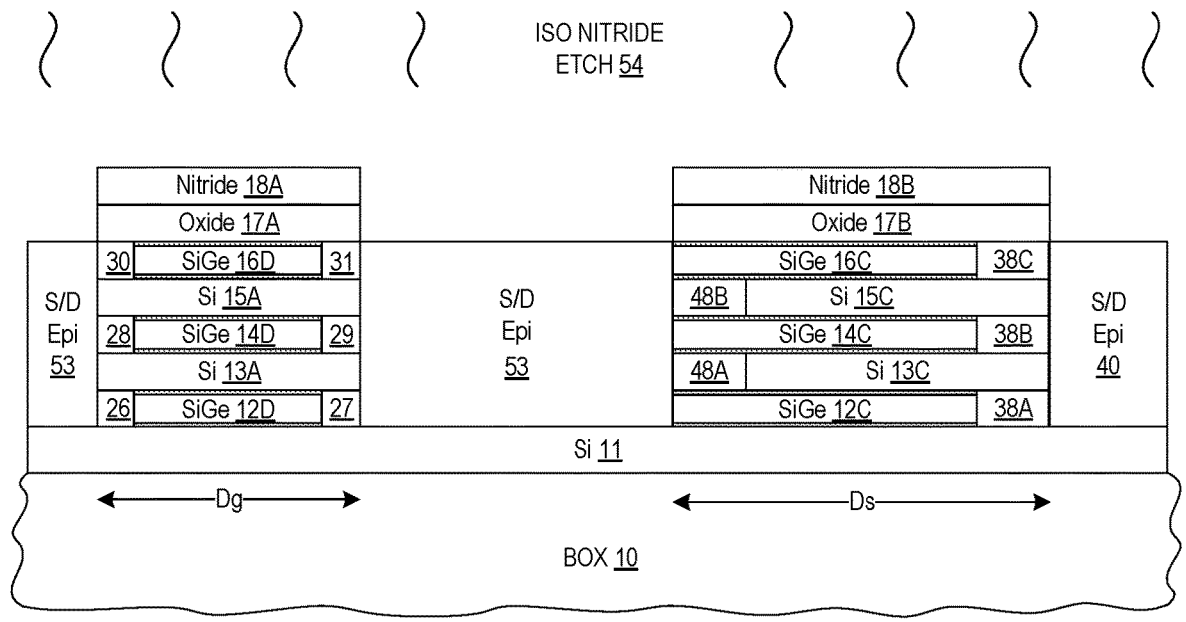
FIG. 23 illustrates processing subsequent to FIG. 22 after performing a nitride etch to remove the third etch mask from the second side of the capacitor/sensor stack.

FIG. 23 illustrates processing of the semiconductor structure subsequent to FIG. 22 after removing the third etch mask 42B from the capacitor/sensor stack. While any suitable etch process may be used, the third etch mask 42B may be etched with an isotropic nitride etch process 54 to remove or strip the third etch mask 42B, leaving the transistor and capacitor/sensor stacks exposed. As will be appreciated, the nitride etch process 54 may etch partially into any exposed portions of the underlying nitride layer 18A, 18B. In addition or in the alternative, the underlying nitride layers 18A, 18B may be formed with different stoichiometries of silicon-rich nitride which resist the nitride etch process 54.

Figure 24:
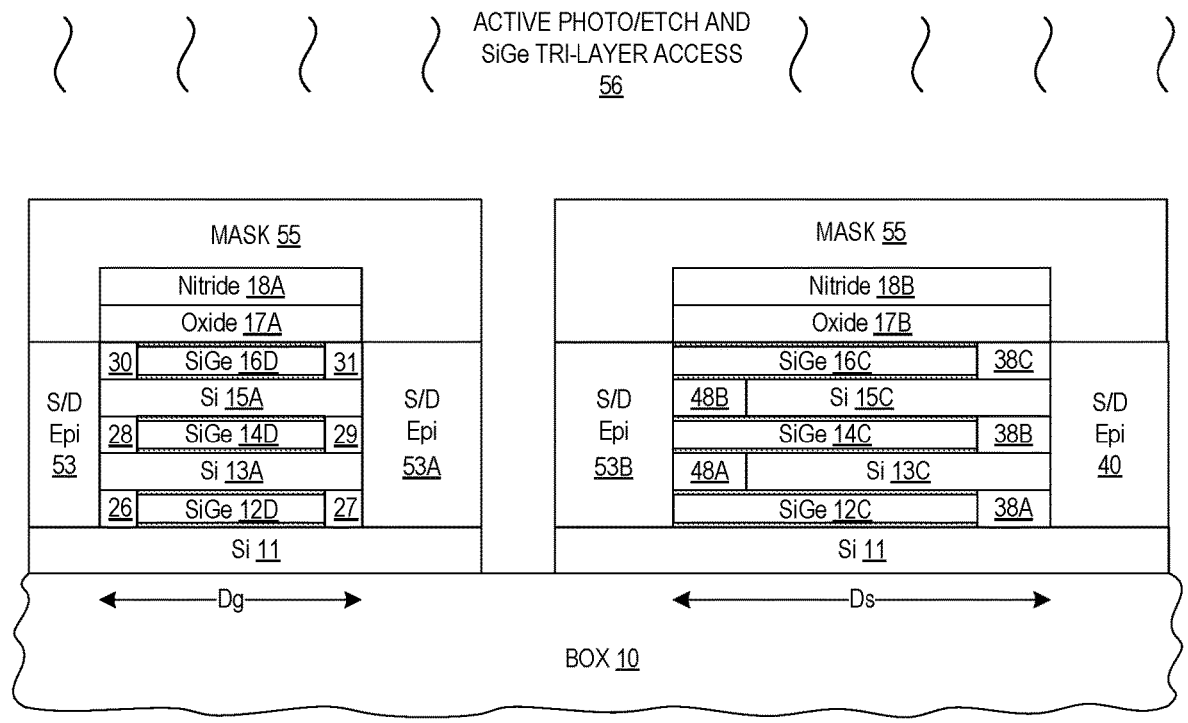
FIG. 24 illustrates processing subsequent to FIG. 23 after performing a patterned active etch to etch the source/drain regions and to expose the remnant silicon germanium tri-layer nanosheets in the transistor and capacitor/sensor stacks to a subsequent SiGe etch process.

FIG. 24 illustrates processing of the semiconductor structure subsequent to FIG. 23 after performing a patterned active etch 56 to etch the source/drain regions 53 and to expose the remnant SiGe tri-layer nanosheets 12C/D, 14C/D, 16C/D in the transistor and capacitor/sensor stacks to a subsequent SiGe etch process. While the depicted cross-sectional drawing does not show etch openings that expose the remnant SiGe tri-layer nanosheets, it will be appreciated that the etch openings may be formed in the z-axis plane (in and out of the paper) to expose peripheral ends of the remnant SiGe tri-layer nanosheets. In addition, the active photo/etch and SiGe access process 56 is shown as forming an etch opening which cuts the epitaxial source/drain region 53 into separate epitaxial silicon regions 53A, 53B, but the epitaxial source/drain region 53 could be maintained as a single block that could be used as a common node (e.g., ground) between a transistor in the transistor stack region and the capacitor/sensor stack. While any suitable pattern and etch process may be used, the active photo/etch and SiGe tri-layer access process 56 may include forming a patterned mask (not shown) over the semiconductor structure by depositing, patterning, etching or developing a photoresist or hard mask layer on the transistor and capacitor/sensor stacks and the epitaxial source/drain regions 53. With the openings formed in the patterned photoresist/hard mask, the active photo/etch and SiGe tri-layer access process 56 may also include one or more etch processes that are applied to create SiGe tri-layer access openings in at least the transistor and capacitor/sensor stacks which expose at least the remnant SiGe tri-layer nanosheets 12C/D, 14C/D, 16C/D. The etch processing 56 can include performing a sequence of reactive-ion etching (RIE) steps having suitable etch chemistry properties to remove, in sequence, the exposed portions of the protective nitride layer 18A/B, protective oxide layer 17A/B, and underlying layers of the transistor and capacitor/sensor stacks.

Figure 25:
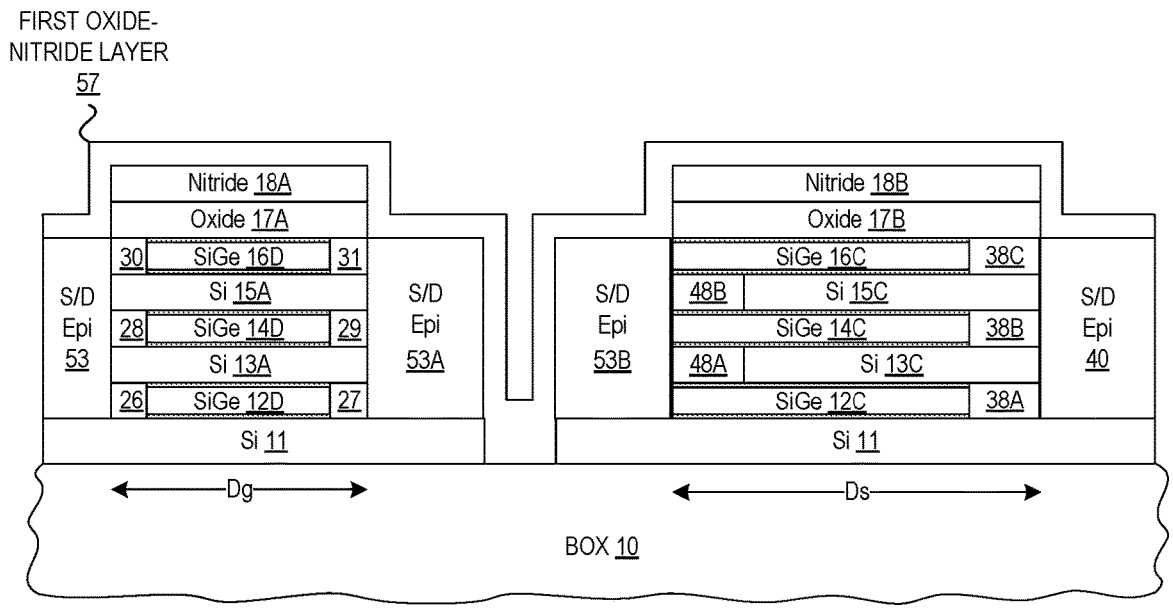
FIG. 25 illustrates processing subsequent to FIG. 24 after a first oxide-nitride layer is deposited over the transistor and capacitor/sensor stacks.

FIG. 25 illustrates processing of the semiconductor structure subsequent to FIG. 24 after a first oxide-nitride layer 57 is deposited over the transistor and capacitor/sensor stacks to seal access to the remnant SiGe tri-layer nanosheets 12C/D, 14C/D, 16C/D in the z-axis direction. In selected embodiments, the first oxide-nitride layer 57 is formed by depositing an oxide and/or nitride layer using any suitable deposition process, such as CVD, PECVD, PVD, ALD, or any combination(s) of the above to a predetermined thickness. The first oxide-nitride layer 57 may be a different material from the underlying protective nitride layer 18A, 18B to facilitate selective etching and removal subsequently in the process. As will be appreciated, the first oxide-nitride layer 57 may be formed as a substantially conformal layer of substantially uniform thickness, but this is not required in all embodiments.

Figure 26:
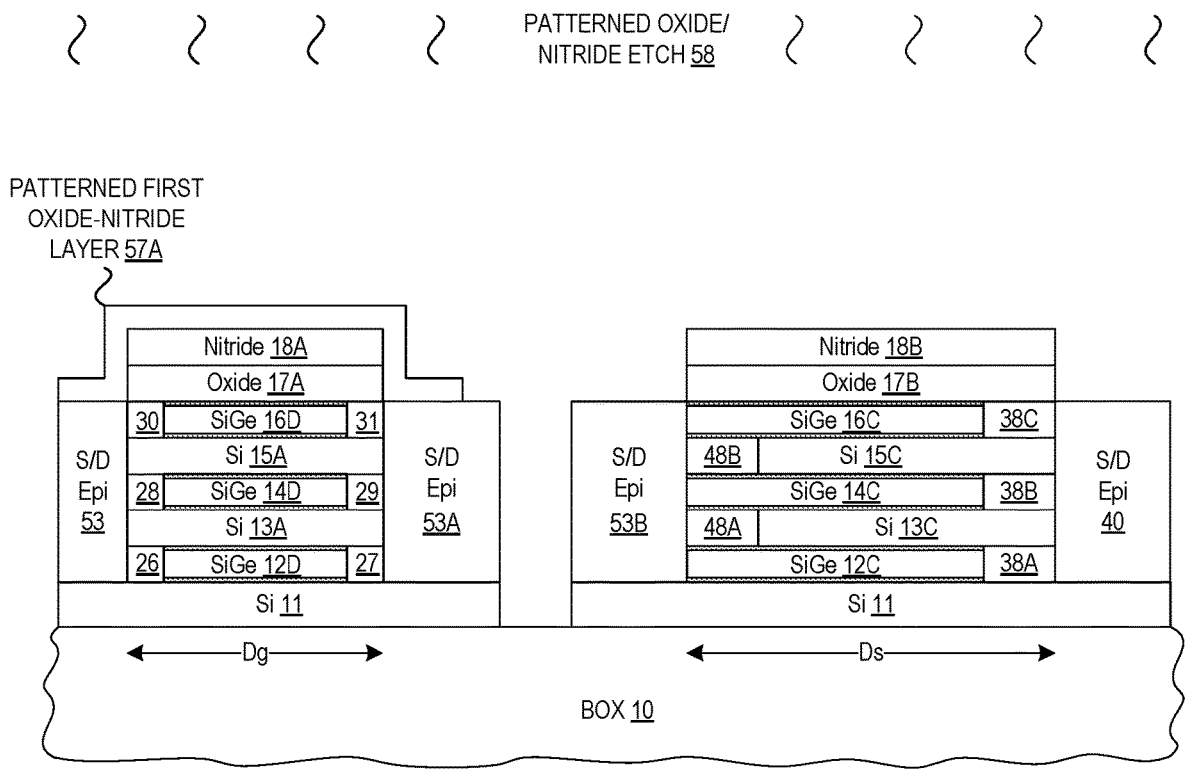
FIG. 26 illustrates processing subsequent to FIG. 25 after the first oxide-nitride layer is patterned and etched to form a fourth etch mask over the transistor stack.

FIG. 26 illustrates processing of the semiconductor structure subsequent to FIG. 25 after the first oxide-nitride layer 57 is patterned and etched with a patterned oxide/nitride etch process 58 to form a fourth etch mask 57A over the transistor stack. While any suitable patterned oxide/nitride etch process 58 may be used, the fourth etch mask 57A may be formed by first depositing, patterning, etching or developing a photoresist or hard mask layer on the first oxide-nitride layer 57 to form a patterned mask (not shown), and then applying an oxide/nitride etch process 58 (e.g., RIE) with the patterned mask in place to remove exposed portions of the first oxide-nitride layer 57, thereby exposing the capacitor/sensor stack while leaving the transistor stack covered by the fourth etch mask 57A.

Figure 27:
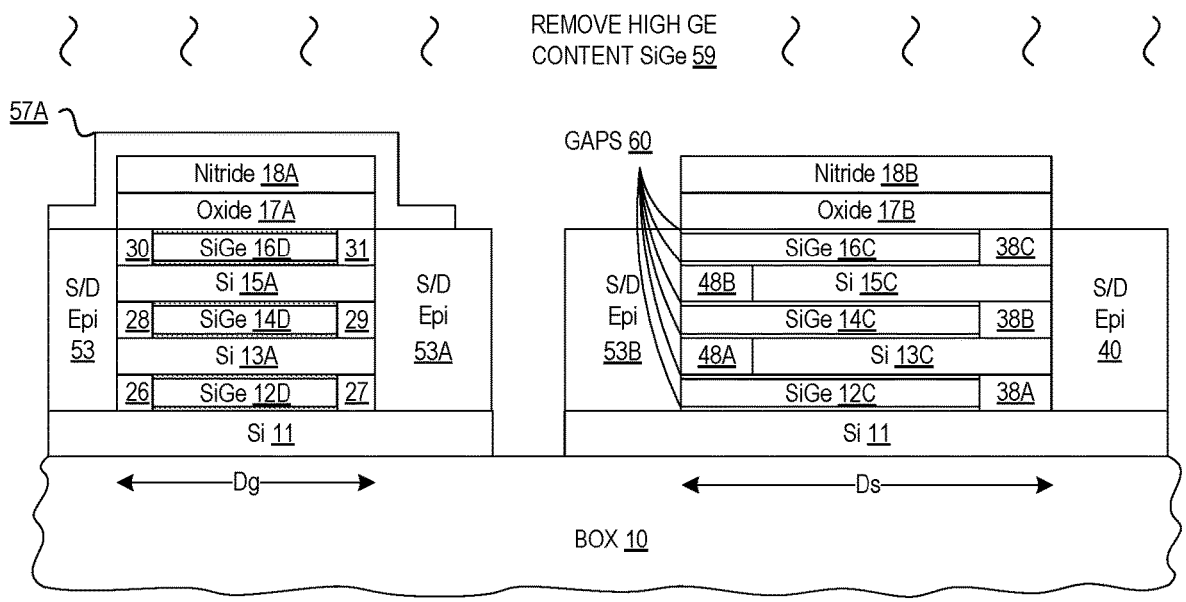
FIG. 27 illustrates processing subsequent to FIG. 26 after selectively etching high germanium content layers from the silicon germanium tri-layer nanosheets in the capacitor/sensor stack to form gaps in the capacitor/sensor stack.

FIG. 27 illustrates processing of the semiconductor structure subsequent to FIG. 26 after applying a high-germanium-content SiGe etch process 59 and selectively etching high-germanium-content layers (e.g., 16-1, 16-3) from the remnant SiGe tri-layer nanosheets in the capacitor/sensor stack while the transistor stack is masked by the fourth etch mask 57A, thereby forming gaps 60 on the first interior side of the capacitor/sensor stack. While any suitable etch process may be used, an isotropic high-germanium-content SiGe etch process 59, such as a timed dry etch chemistry that is targeted to remove the high-germanium content SiGe layers, may be used to selectively remove the high-germanium content SiGe layers (e.g., 16-1, 16-3) while leaving the low-germanium content SiGe layers (e.g., 16-2) in place in the capacitor/sensor stack. For example, a dry etch process may isotropically etch the high-germanium content SiGe selective to low-germanium content SiGe and pure silicon, such as by employing isotropic plasma etching process described in M. D. Henry et al., "Isotropic Plasma Etching of Ge, Si and $SiN_x$ Films," Journal of Vacuum Science and Technology, vol. 34, Issue 5 (Aug. 31, 2016). Alternatively, a wet etch process may isotropically etch the high-germanium content SiGe selective to low-germanium content SiGe and pure silicon, such as by employing a wet etch chemistry of HF, hydrogen peroxide, and acetic acid as described in B. Hollander et al, "Wet Chemical Etching of Si, $Si_{1-x}Ge_x$, and Ge in $HF:H_2O_2:CH_3COOH$," Journal of The Electrochemical Society, Vol. 157, No, 6, pp. H643-H646 (Apr. 23, 2010). Both of these SiGe etches have higher etch rates for higher germanium content SiGe layers. At the conclusion of the high-germanium-content SiGe etch process 59, the remnant high-germanium-content SiGe layers of the capacitor/sensor stack, which were exposed by the patterned active etch 56 and not protected by the fourth etch mask 57A, are selective etched to form gaps 60 which separate the remaining low-germanium content SiGe layers (e.g., 16-2) from the adjacent silicon nanosheets (e.g., 15), thereby forming SiGe electrodes from the remaining low-germanium-content SiGe nanosheets 12C-2, 14C-2, 16C-2 in the capacitor/sensor stack.

Figure 28:
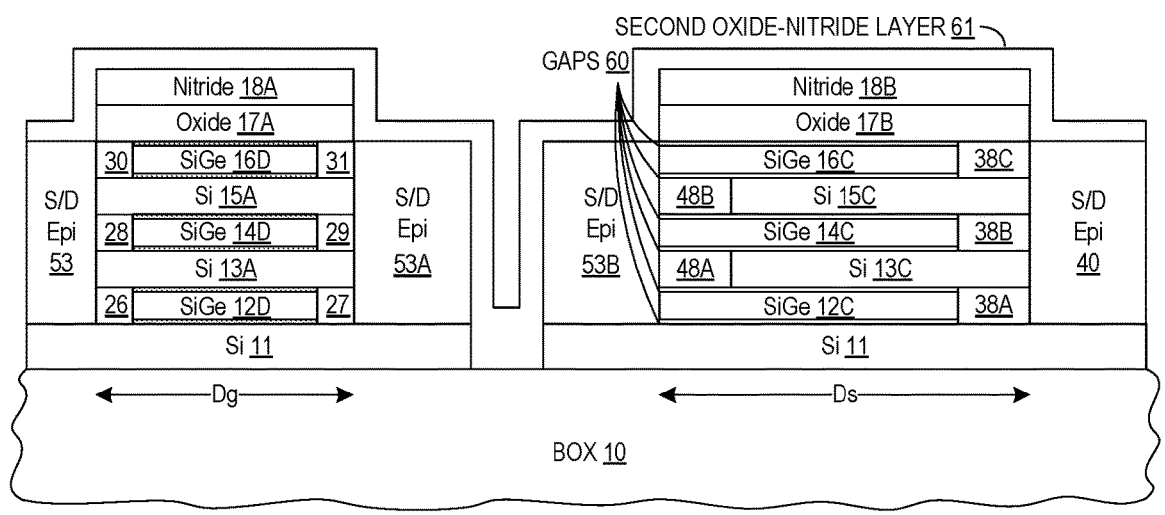
FIG. 28 illustrates processing subsequent to FIG. 27 after a second oxide-nitride layer is deposited over the transistor and capacitor/sensor stacks.

FIG. 28 illustrates processing of the semiconductor structure subsequent to FIG. 27 after a second oxide-nitride layer 61 is deposited over the transistor and capacitor/sensor stacks to seal access to the remnant SiGe tri-layer nanosheets in the z-axis direction. In selected embodiments, the second oxide-nitride layer 61 is formed by depositing an oxide and/or nitride layer using any suitable deposition process, such as CVD, PECVD, PVD, ALD, or any combination(s) of the above to a predetermined thickness. The second oxide-nitride layer 61 may be a different material from the underlying protective nitride layer 18A, 18B to facilitate selective etching and removal subsequently in the process. As will be appreciated, the second oxide-nitride layer 61 may be formed as a substantially conformal layer of substantially uniform thickness, but this is not required in all embodiments.

Figure 29:
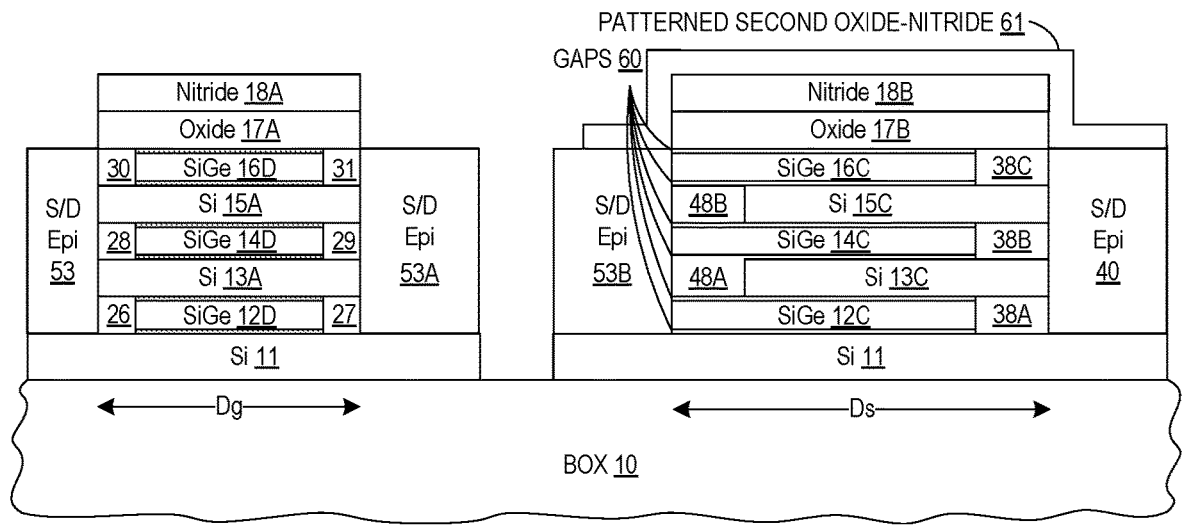
FIG. 29 illustrates processing subsequent to FIG. 28 after the second oxide-nitride layer is patterned and etched to form a fifth etch mask over the capacitor/sensor stack.

FIG. 29 illustrates processing of the semiconductor structure subsequent to FIG. 28 after the second oxide-nitride layer 61 is patterned and etched with a patterned oxide/nitride etch process to form a fifth etch mask 61A over the capacitor/sensor stack. While any suitable pattern and etch process may be used, the fifth etch mask 61A may be formed by first depositing, patterning, etching or developing a photoresist or hard mask layer on the second oxide-nitride layer 61 to form a patterned mask (not shown), and then applying a nitride etch process (e.g., RIE) with the patterned mask in place to remove exposed portions of the second oxide-nitride layer 61, thereby exposing the transistor stack while leaving the capacitor/sensor stack covered by the fifth etch mask 61A.

Figure 30:
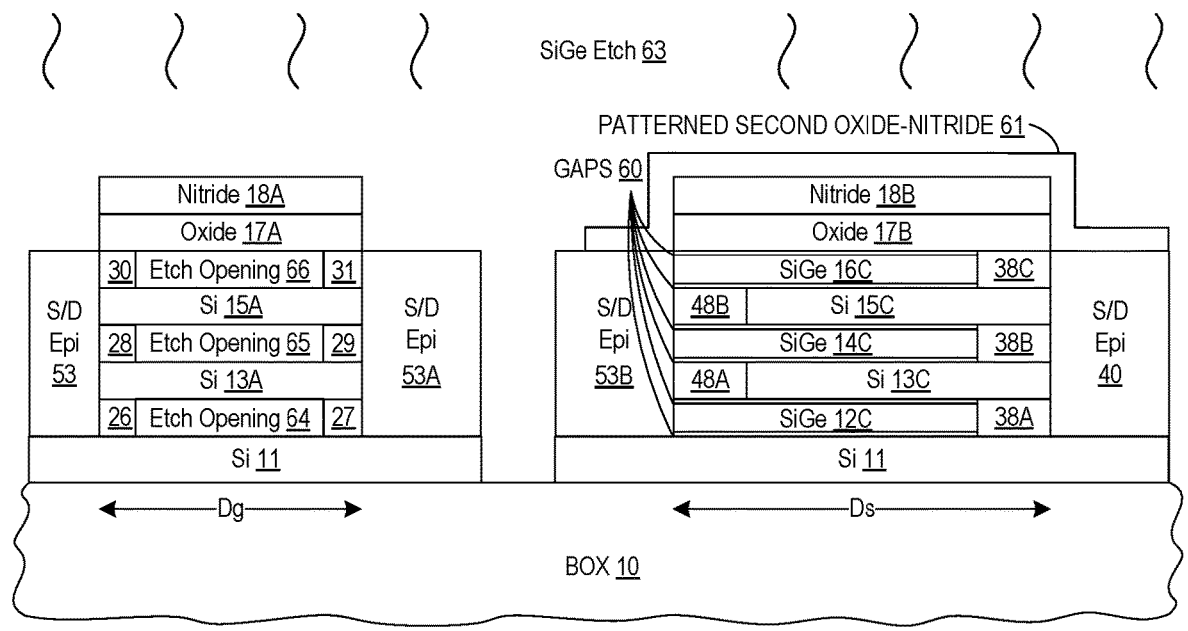
FIG. 30 illustrates processing subsequent to FIG. 29 after selectively etching silicon germanium tri-layer nanosheets from the transistor stack to form gate openings in the transistor stack.

FIG. 30 illustrates processing of the semiconductor structure subsequent to FIG. 29 after selectively etching silicon germanium tri-layer nanosheets from the transistor stack while the capacitor/sensor stack is masked by the fifth etch mask 61A, thereby forming gate openings 64-66 in the transistor stack. While any suitable SiGe etch process may be used, a controlled SiGe recess etch process 63, such as a timed isotropic dry etch, may be used to remove each sandwiched stack of SiGe tri-layer nanosheets (e.g., 12D, 14D, 16D) from the transistor stack. At the conclusion of the SiGe etching process 63, the remnant SiGe tri-layer nanosheets of the transistor stack are replaced by gate openings 64-66 where the gate electrodes for the nanosheet transistors will be formed in the transistor stack. At the depicted processing stage, the fifth etch mask 61A remains to block etching of the capacitor/sensor stack by the selective SiGe etch 63.

Figure 31:
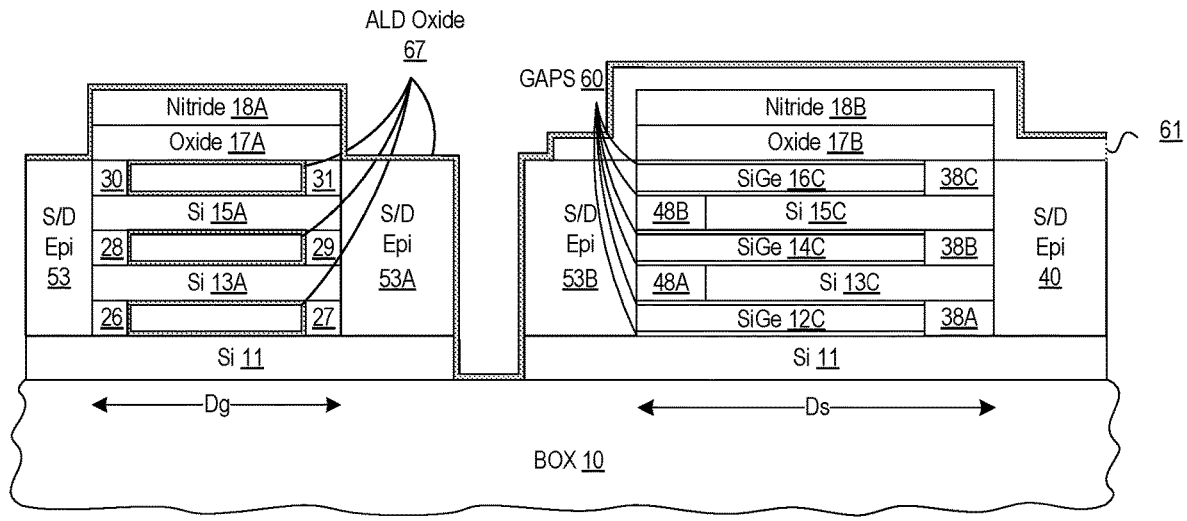
FIG. 31 illustrates processing subsequent to FIG. 30 after an atomic layer deposition (ALD) oxide layer is formed as a liner layer over the transistor and capacitor/sensor stacks and in the gate openings of the transistor stack.

FIG. 31 illustrates processing of the semiconductor structure subsequent to FIG. 30 after a conformal gate dielectric layer 67 is formed as a liner layer over the transistor and capacitor/sensor stacks and in the gate openings 64-66 of the transistor stack. In selected embodiments, the conformal gate dielectric layer 67 is formed with an atomic layer deposition (ALD) to conformally deposit an ALD oxide layer 67 to a desired gate dielectric thickness (e.g., 5-50 Angstroms) on the interior surfaces of the gate openings 64-66 without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers 67 in the gate openings 64-66, the resulting ALD oxide layer 67 forms a substantially conformal layer over the upper surface of the semiconductor structure.

Figure 32:
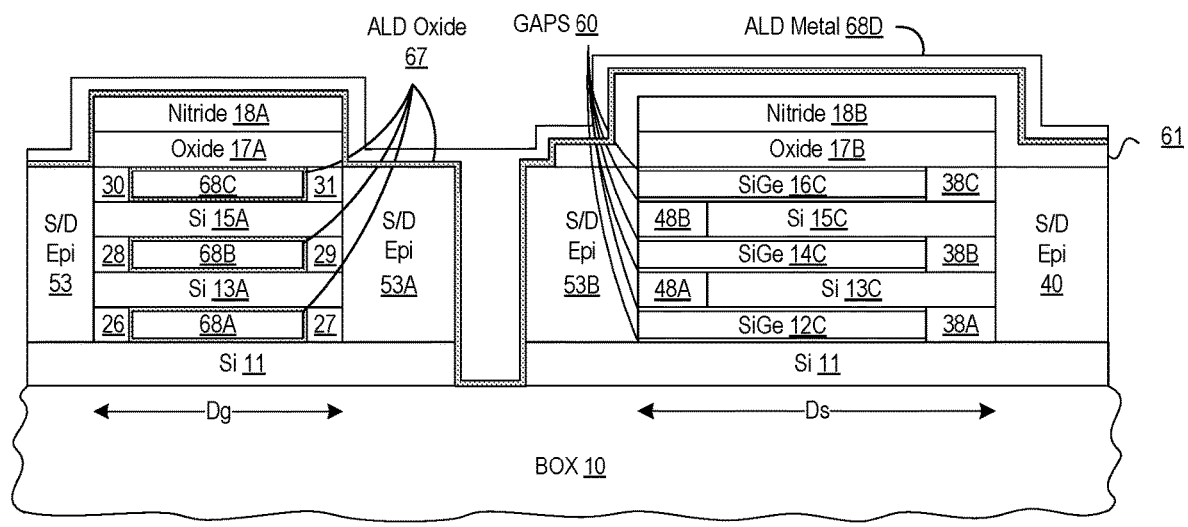
FIG. 32 illustrates processing subsequent to FIG. 31 after an atomic layer deposition (ALD) metal layer is formed as a liner layer to cover the transistor and capacitor/sensor stacks and to fill the gate openings of the transistor stack.

FIG. 32 illustrates processing of the semiconductor structure subsequent to FIG. 31 after one or more conductive gate electrode layers 68A-C are formed as a liner layer to cover the transistor and capacitor/sensor stacks and to fill the gate openings 64-66 of the transistor stack. In selected embodiments, the conductive gate electrode layer(s) 68 are formed with an atomic layer deposition (ALD) process to conformally deposit at least a first ALD metal layer 68A-C on the ALD oxide layers 67 to at least partially fill the remaining gate openings 64-66. In selected embodiments, the ALD metal deposition process may be implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 68A-68C in the gate openings 64-66, the ALD metal process forms an ALD metal layer 68D as a substantially conformal layer over the upper surface of the semiconductor structure.

Figure 33:
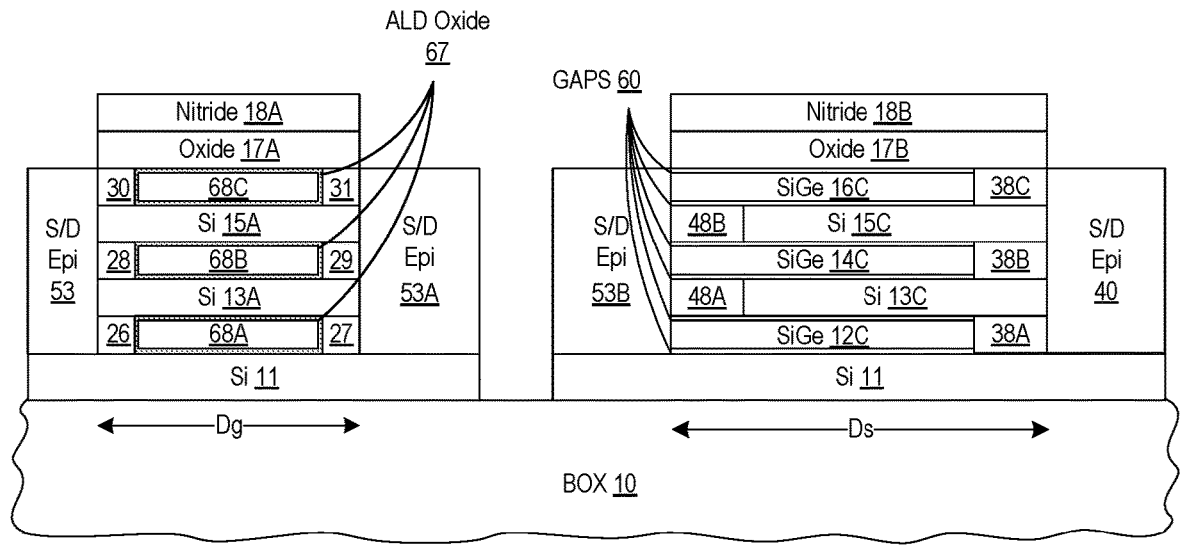
FIG. 33 illustrates processing subsequent to FIG. 32 after removing the ALD metal layer, ALD oxide layer, and fifth etch mask from the upper surface of the transistor and capacitor/sensor stacks.

FIG. 33 illustrates processing of the semiconductor structure subsequent to FIG. 32 after applying one or more etch processes to remove the ALD metal layer 68D, surface ALD oxide layer 67, and fifth etch mask 61A from the upper surface of the transistor and capacitor/sensor stacks. While any suitable etch process may be used, the etch processing can include one or more isotropic etching steps (e.g., RIE) having suitable etch chemistry properties to remove, in sequence, the ALD metal layer 68D, surface ALD oxide layer 67, and fifth etch mask 61A from the surface of the semiconductor structure. The etch processing should leave the transistor and capacitor/sensor stacks in place and covered by the protective oxide layers 17A, 17B and nitride layers 18A, 18B. Again, the sidewalls of the protective oxide layers 17A, 17B and nitride layers 18A, 18B are shown as being substantially vertical, though minor deviations in the sidewall profile may occur at each layer due to etch processing variations.

Figure 34:
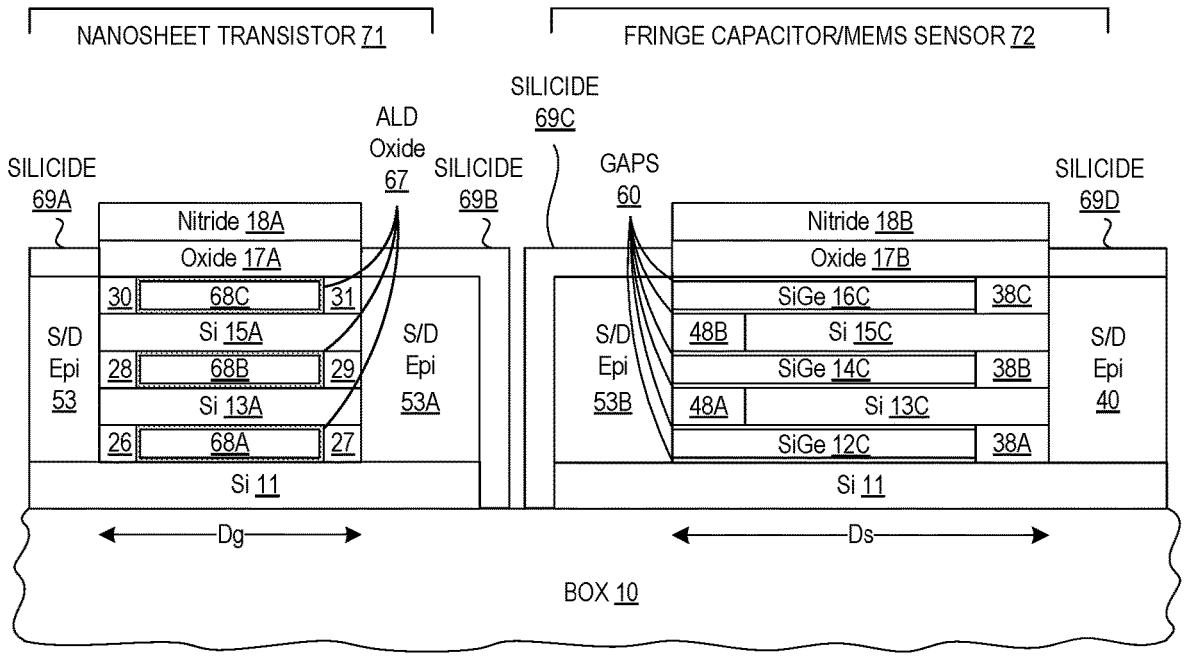
FIG. 34 illustrates processing subsequent to FIG. 33 after selectively forming silicide layers on exposed source/drain regions.

FIG. 34 illustrates processing of the semiconductor structure subsequent to FIG. 33 after selectively forming silicide layers 69A-D on exposed epitaxial source/drain regions 53, 53A/B, 40. As formed, the silicide layers 69A-D facilitate electrical connection to the epitaxial source/drain regions 53, 53A/B, 40. While any desired silicide formation process may be used to form the silicide layers 69A-D (such as CoSi2 or NiSi), an example silicide formation sequence would be to deposit or sputter a conductive metal layer (e.g., cobalt or nickel) over the semiconductor structure, followed by a heating step to react the metal layer with the source/drain regions 53, 53A/B, 40 to form silicide layers 69A-D. In an illustrative embodiment, the reaction of the metal layer and the source/drain regions 53, 53A/B, 40 is promoted by performing an initial rapid thermal anneal step (e.g., 400-

600° C.), followed by a Piranha clean step to remove excess metal, and then followed by a second rapid thermal anneal step (e.g., 650-850° C.). The time and temperature of the initial rapid thermal anneal step are selected so that the metal layer reacts with the exposed surfaces of the source/drain regions 53, 53A/B, 40. After the Piranha clean step, the time and temperature of the second rapid thermal anneal step are selected so that the reacted silicide 69A-D is driven into a low resistivity phase.

At the process stage shown in FIG. 34, there is provided a nanosheet transistor 71 and fringe capacitor or MEMS sensor 72 formed on a single die with a single nanosheet process flow, thereby providing a straightforward method for integrating fringe capacitors or MEMS sensors with advanced nanosheet transistors on the same die. As illustrated, the nanosheet transistor 71 includes a first nanosheet transistor including the first silicon channel region 15A under control of a gate electrode 68B, 68C; a second nanosheet transistor including a second silicon channel region 13A under control of a gate electrode 68A, 68B; and a third planar FET transistor including the third silicon channel region 11 under control of the gate electrode 68A. However, it will be appreciated that the third planar FET transistor could be replaced with a third nanosheet transistor by including an additional SiGe layer (not shown) below the silicon nanosheet 11 in the transistor stack which is processed with the same steps applied to the SiGe tri-layer nanosheets 12A, 14A, 16A described herein. In addition, the fringe capacitor or MEMS sensor 72 includes a first set of fixed SiGe electrodes 12C, 14C, 16C that are spaced apart from a second set of fixed Si electrodes 13C, 15C, thereby creating a high-density capacitor or a MEMS sensor that utilizes tunneling current differences between the SiGe and Si electrodes (or diaphragms) for acceleration and/or vibration sensing.

While specific implementation details are described herein for integrating the fabrication of capacitor/sensors with the nanosheet transistor process flow to make dual use of fabrication steps, it will be appreciated that additional or fewer processing steps may be used and/or combined. For example, a shared set of fabrication steps may be used to pattern and etch an initial Si/SiGe superlattice substrate structure 11-18 to form separate transistor and capacitor/sensor stacks. Subsequently, the capacitor/sensor stack may be masked or sealed so that nanosheet processing steps are applied to the transistor stack to form the transistor 71, followed by masking or sealing the transistor 71 formed in the transistor stack so that nanosheet processing steps are applied to the capacitor/sensor stack to form the fringe capacitor or MEMS sensor 72. This bifurcated approach for separately processing the transistor and capacitor/sensor stacks advantageously eliminates some of the selective mask formation steps, and also enables the transistor and capacitor/sensor stack structures to be as independent as possible to provide for separate optimization. In other embodiments, additional processing steps may be included to improve device performance. For example, when used as a capacitor, the capacitive coupling between the fixed capacitive electrodes in the capacitor/sensor stack can be increased by forming a polysilicon plate on top of the capacitor/sensor stack to increase capacitive coupling with the top SiGe nanosheet, and by also building a dielectrically isolated polysilicon or Si plate underneath the capacitor/sensor stack to increase capacitive coupling with the bottom SiGe nanosheet. In addition, a separate capacitor/sensor stack may be built for a capacitor/sensor based on a different Si—SiGe stack having different thicknesses for the Si and SiGe tri-layers to create a different vertical spacing between the Si and SiGe electrodes and a different thickness for the Si and SiGe electrodes. By providing an additional capacitor/sensor stack with different thicknesses of the Si and SiGe tri-layer nanosheets, device performance can be separately optimized.

Figure 35:
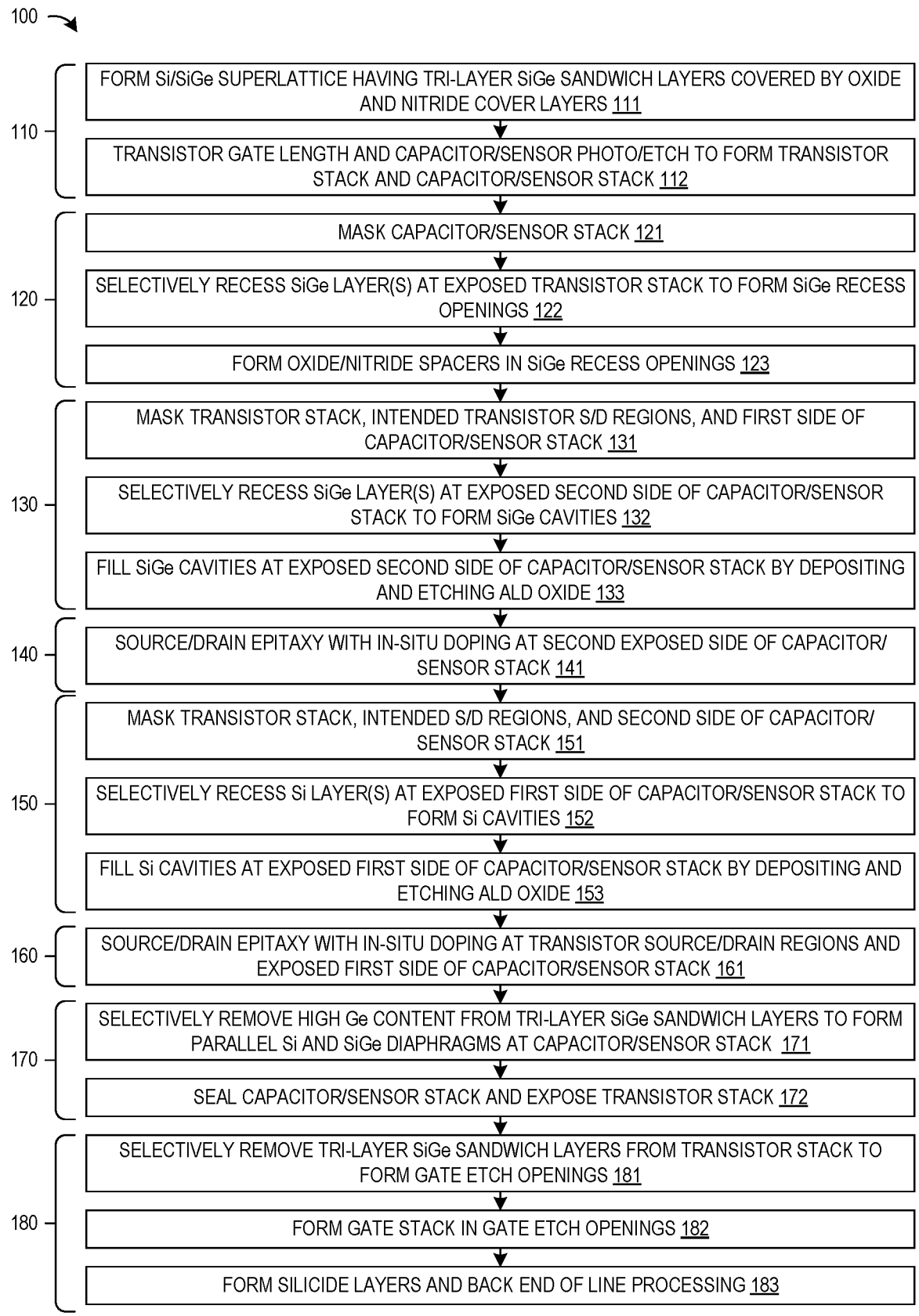
FIG. 35 illustrates a simplified process flow for integrating the fabrication of nanosheet transistors and capacitor/sensors in accordance with selected embodiments of the present disclosure.

Turning now to FIG. 35, there is illustrated a simplified process flow 100 for integrating the fabrication of nanosheet transistors and capacitor/sensors having dissimilar materials used to form the electrodes in accordance with selected embodiments of the present disclosure. Stated generally, the process includes an initial set of fabrication steps 110 to fabricate a wafer substrate with a Si/SiGe superlattice structure of alternating silicon nanosheets and silicon germanium tri-layer nanosheets patterned and etched to form a transistor stack and capacitor/sensor stack. A second set of fabrication steps 120 masks the capacitor/sensor stack and processes the transistor stack to partially etch exposed SiGe tri-layer nanosheets and form recess openings in the Si/SiGe superlattice which are filled with inner nitride spacers to define remnant SiGe tri-layer nanosheets. A third set of fabrication steps 130 masks the transistor stack and a first side of the capacitor/sensor stack before partially etching exposed SiGe tri-layer nanosheets from the second side of the capacitor/sensor stack to form recess openings which are filled with first oxide spacers to define remnant SiGe tri-layer nanosheets in the capacitor/sensor stack. A fourth set of fabrication steps 140 forms an epitaxial source/drain region on the second side of the capacitor/sensor stack. A fifth set of fabrication steps 150 masks the transistor stack and the second side of the capacitor/sensor stack before partially etching exposed Si nanosheets from the first side of the capacitor/sensor stack to form recess openings which are filled with second oxide spacers to define remnant Si nanosheets in the capacitor/sensor stack. A sixth set of fabrication steps 160 forms epitaxial source/drain regions are formed on the sides of the transistor stack and the first side of the capacitor/sensor stack. A seventh set of fabrication steps 170 selectively processes the capacitor/sensor stack to remove high-germanium-content SiGe layers, thereby forming SiGe electrodes from the remaining low-germanium-content SiGe nanosheets in the capacitor/sensor stack. An eighth set of fabrication steps 180 selectively processes the transistor stack to remove remnant SiGe layers and to form SiGe gate etch openings which are filled with atomic layer deposition (ALD) oxide and metal layers to form a first set of transistor gate electrodes in the transistor stack. As will be appreciated, each set of fabrication steps 110, 120, 130, 140, 150, 160, 170, 180 can be implemented in different embodiments using the processing steps disclosed herein or modifications thereto as will be understood by those skilled in the art. However, by way of illustrating selected example embodiments of the present disclosure, each set of fabrication steps 110, 120, 130, 140, 150, 160, 170, 180 is described hereinbelow with an example processing step sequence.

Starting with the initial set of fabrication steps 110, the process 100 may begin at step 111 with a wafer substrate which is processed to form a silicon/silicon germanium (SiGe) superlattice structure having alternating Si and SiGe tri-layer sandwich layers covered by oxide and nitride cover layers. In selected embodiments, the SiGe superlattice structure is formed by epitaxially growing alternating layers of Si and SiGe tri-layer sandwiches (each formed with a high-Ge-content SiGe nanosheet, a low-Ge-content SiGe nanosheet, and a high-Ge-content SiGe nanosheet) on a buried oxide substrate layer, with the Si/SiGe superlattice structure covered by depositing an oxide protective layer and/or a protective nitride layer.

The initial set of fabrication steps 110 may also include a transistor gate length photo and etch step 112 where the SiGe superlattice structure is processed with a gate length photo/etch process to form a transistor stack and a capacitor/sensor stack (depending on whether a fringe capacitor or MEMS sensor will be formed). For example, a photoresist layer may be deposited, patterned, etched and developed to form a patterned photoresist or hard mask layer on the protective oxide or nitride layer. With the patterned photoresist/hard mask layer in place, the processing at step 112 may include applying one or more etch processes to create the separately delineated transistor and capacitor/sensor stacks. The etch processing can include a sequence of reactive-ion etching (RIE) steps having suitable etch chemistry properties to sequentially remove exposed portions of the protective oxide or nitride and underlying layers of the SiGe superlattice structure.

To process the transistor stack to form and protect remnant SiGe tri-layer sandwich nanosheets having a first gate length dimension, the disclosed second set of fabrication steps 120 may include a masking step 121 for selectively masking the capacitor/sensor stack. For example, a thin nitride layer may be deposited over the semiconductor structure, and then patterned and isotropically etched to leave the nitride layer only on top the capacitor/sensor stack, thereby exposing the transistor stack.

The second set of fabrication steps 120 may also include a selective recess etch step 122 where the SiGe tri-layer sandwich layers at the exposed sides of the transistor stack are selectively etched to form SiGe recess openings. For example, a controlled etch process, such as a timed isotropic dry etch, may be applied to selectively recess the SiGe tri-layer sandwich layers exposed at the sides of the transistor stack, thereby forming remnant SiGe tri-layer sandwich nanosheets that are defined between the SiGe recess openings.

The second set of fabrication steps 120 may also include a nitride spacer formation step 123 for protecting the remnant SiGe tri-layer sandwich nanosheets in the transistor stack from subsequent processing. For example, a first inner nitride layer may be deposited over the semiconductor structure, and then patterned and isotropically etched to leave the inner nitride layer only in the SiGe recess openings of the transistor stack.

To process the capacitor/sensor stack to form and protect remnant SiGe tri-layer sandwich nanosheets that will be used to form electrodes in the capacitor/sensor stack, the disclosed third set of fabrication steps 130 may include a masking step 131 for selectively masking the transistor stack, intended source/drain regions and a first interior side of the capacitor/sensor stack. For example, a thin nitride layer may be deposited over the semiconductor structure, and then patterned and isotropically etched to leave the thin nitride layer only on top the transistor stack and the first interior side of the capacitor/sensor stack, thereby exposing the second exterior side of the capacitor/sensor stack.

A third set of fabrication steps 130 may also include a selective recess etch step 132 where the SiGe tri-layer sandwich layers at the exposed second side of the capacitor/sensor stack are selectively etched to form SiGe recess cavities. For example, a controlled etch process, such as a timed isotropic dry etch, may be applied to selectively recess the SiGe tri-layer sandwich layers at the second exposed exterior side of the capacitor/sensor stack, thereby forming remnant SiGe tri-layer sandwich nanosheets that are defined by the SiGe cavities.

The third set of fabrication steps 130 may also include a first dielectric spacer formation step 133 for protecting the remnant SiGe tri-layer sandwich nanosheets in the capacitor/sensor stack from subsequent processing. For example, a first set of dielectric spacers may be formed on the second exposed exterior side of the capacitor/sensor stack by depositing an ALD oxide layer over the semiconductor structure, and then isotropically etching the ALD oxide layer to leave ALD oxide spacers only in the SiGe cavities of the capacitor/sensor stack.

To form an epitaxial silicon region adjacent to the capacitor/sensor stack, the fourth set of fabrication steps 140 may include one or more epitaxial formation step(s) 141 for selectively forming and doping or implanting an epitaxial region at the second, exposed side of the capacitor/sensor stack. For example, a first epitaxial silicon deposition or growth process may be used to selectively form a first epitaxial silicon region on an exposed second side of the capacitor/sensor stack up to the height of the capacitor sensor stack, either by a controlled epitaxial growth process or an overgrowth process coupled with epitaxial silicon etch and/or polish steps. As will be appreciated, the first epitaxial silicon region may be doped or implanted with N-type or P-type impurities.

To process the capacitor/sensor stack to form and protect remnant Si nanosheets that will be used to form electrodes in the capacitor/sensor stack, the disclosed fifth set of fabrication steps 150 may include a masking step 151 for selectively masking the transistor stack, intended source/drain regions and the second exterior side of the capacitor/sensor stack. For example, a thin nitride layer may be deposited over the semiconductor structure, and then patterned and isotropically etched to leave the thin nitride layer only on top of the transistor stack and the second exterior side of the capacitor/sensor stack, thereby exposing the first interior side of the capacitor/sensor stack.

A fifth set of fabrication steps 150 may also include a selective recess etch step 152 where the silicon nanosheet layers at the exposed first side of the capacitor/sensor stack are selectively etched to form silicon recess cavities. For example, a controlled etch process, such as a timed isotropic dry etch, may be applied to selectively recess the silicon nanosheet layers at the first exposed interior side of the capacitor/sensor stack, thereby forming remnant silicon nanosheets that are defined by the silicon recess cavities.

The fifth set of fabrication steps 150 may also include a second dielectric spacer formation step 153 for protecting the remnant silicon nanosheets in the capacitor/sensor stack from subsequent processing. For example, a second set of dielectric spacers may be formed on the first exposed interior side of the capacitor/sensor stack by depositing an ALD oxide layer over the semiconductor structure, and then isotropically etching the ALD oxide layer to leave ALD oxide spacers only in the silicon recess cavities of the capacitor/sensor stack.

To form epitaxial source/drain regions on the sides of the transistor stack and the first side of the capacitor/sensor stack, the sixth set of fabrication steps 160 may include one or more epitaxial source/drain formation step(s) 161 for selectively forming and doping or implanting the epitaxial source/drain regions on the sides of the transistor stack and adjacent to the first side of the capacitor/sensor stack. For example, a second epitaxial silicon deposition or growth process may be used to selectively form epitaxial source/ drain regions to surround the transistor stack up to the height of the transistor stack, either by a controlled epitaxial growth process or an overgrowth process coupled with epitaxial silicon etch and/or polish steps. Depending on the type of nanosheet transistor formed in the transistor stack, the epitaxial source/drain regions may be doped or implanted with N-type or P-type impurities. In addition, the formation of doped epitaxial source/drain regions may include one or more anneal processes to promote formation of crystalline structures in the epitaxial source/drain regions and/or may include one or more etch or polish steps to planarize the top surface of the epitaxial source/drain regions.

To process the remnant SiGe tri-layer sandwich nanosheets to form electrodes in the capacitor/sensor stack, the seventh set of fabrication steps 170 may include one or more selective SiGe etch steps 171 for selectively removing high-germanium-content SiGe from the remnant SiGe tri-layer sandwich nanosheets in the capacitor/sensor stack to form parallel silicon and SiGe diaphragms in the capacitor/sensor stack. For example, the transistor stack and capacitor/sensor stack may be masked with an active photo/etch process to access the underlying remnant SiGe tri-layer sandwich nanosheets in the transistor and capacitor/sensor stacks. For example, a photoresist layer may be deposited, patterned, etched and developed to form a patterned photoresist or hard mask layer with mask openings positioned to access the underlying remnant SiGe tri-layer sandwich nanosheets. With the patterned photoresist/hard mask layer in place, the processing at step 171 may include applying one or more etch processes to access the underlying remnant SiGe tri-layer sandwich nanosheets in the transistor and capacitor/sensor stacks. The etch process can include a sequence of reactive-ion etching (RIE) steps having suitable etch chemistry properties to sequentially remove exposed portions of the underlying layers, but without removing the accessed remnant SiGe tri-layer sandwich nanosheets. With the transistor stack sealed or masked off by a first mask (such as by forming a first patterned oxide-nitride layer over the transistor stack), the processing at step 171 also processes the capacitor/sensor stack to selectively remove high-germanium-content SiGe layers from the remnant SiGe tri-layer sandwich nanosheets, thereby forming SiGe electrode layers from the remaining low-germanium-content SiGe nanosheets in the capacitor/sensor stack.

The seventh set of fabrication steps 170 may also include a masking step 172 for masking or sealing the capacitor/sensor stack and exposing the transistor stack. For example, the first mask may be removed from the transistor stack, and a second mask may be formed over the capacitor/sensor stack (such as by forming a second patterned oxide-nitride layer over the capacitor/sensor stack), thereby exposing the transistor stack.

To selectively process the transistor stack to form a first set of transistor gate electrodes, the disclosed eighth set of fabrication steps 180 may include a selective SiGe etch step 181 where the remnant SiGe tri-layer sandwich layers in the transistor stack are selectively removed to form gate etch openings. For example, a controlled etch process, such as a timed isotropic dry etch, may be applied to selectively etch and remove the remnant SiGe tri-layer sandwich layers exposed at the transistor stack, thereby forming gate etch openings where the remnant SiGe tri-layer sandwich layers were located in the transistor stack.

The eighth set of fabrication steps 180 may also include a gate stack or electrode formation step 182 for forming gate electrodes in the gate etch openings of the transistor stack by sequentially depositing first ALD oxide and metal layers. For example, the gate stacks or electrodes may be formed by depositing a first ALD oxide layer to form a conformal thin dielectric layer in the gate etch openings of the transistor stack, and then depositing a first ALD metal layer to form gate electrodes by filling the gate etch openings.

At this process stage, the front end of line processing of the nanosheet transistors in the transistor stack is complete except for any silicidation, though additional processing steps can be performed to form additional circuit elements, such as sidewall capacitors and/or non-volatile memory cells.

The disclosed eighth set of fabrication steps 180 may use one or more steps 183 to form silicide layers along with any required back-end-of-line processing to form contacts. For example, the silicide formation sequence of step 183 may start with one or more initial silicide formation steps to form silicide layers on exposed source/drain regions to facilitate electrical connection thereto.

It will be appreciated that additional processing steps will be used to complete the fabrication of the nanosheet transistors 71 and capacitor/sensors 72 into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for forming a semiconductor device which integrates the fabrication of nanosheet transistors and capacitors and/or sensors. In the disclosed method, a stack of alternating first and second semiconductor structures is provided on a substrate. In selected embodiments, the first and second semiconductor structures are formed, respectively, with semiconductor materials having different isotropic etch rates from one another. In selected embodiments, each first semiconductor structure includes a silicon nanosheet layer, and each second semiconductor structure includes a sandwiched stack of silicon germanium nanosheet layers comprising top and bottom SiGe nanosheet layers having different isotropic etch rates from a middle SiGe nanosheet layer. The disclosed method also includes selectively etching the stack of alternating first and second semiconductor structures to form a transistor stack and a device stack on the substrate. In addition, the disclosed method includes processing the transistor stack and the device stack to form gate electrodes between the first semiconductor structures in the transistor stack and to form first electrodes from the second semiconductor structures in the device stack. In selected embodiments, the transistor stack and a device stack are processed to form second electrodes from the first semiconductor structures in the device stack. As finally formed, the device stack may include a capacitor having a first capacitive electrode formed with the first electrodes, and a second capacitive electrode formed from the first semiconductor structures in the device stack and capacitively coupled to the first capacitive electrode. In other embodiments, the device stack may include a MEMS sensor having a first sensor electrode formed with the first electrodes, and a second sensor electrode formed from the first semiconductor structures in the device stack.

In another form, there is provided a method for fabricating a semiconductor device which integrates the fabrication of nanosheet transistors and capacitor/sensors. In the disclosed fabrication method, a stack of alternating first and second nanosheet structures is provided on a substrate, where each first nanosheet structure includes a first semiconductor layer (e.g., silicon) and where each second nanosheet structure comprises a tri-layer sandwich of top, middle and bottom nanosheet layers (e.g., a top nanosheet layer of high-germanium-content silicon germanium, a middle nanosheet layer of low-germanium-content silicon germanium, and a bottom nanosheet layer of high-germanium-content silicon germanium). In selected embodiments, the stack of alternating first and second nanosheet structures is provided by epitaxially growing the first nanosheet structure and the second nanosheet structure over the substrate. In addition, the disclosed fabrication method selectively etches the stack of alternating first and second nanosheet structures to form a nanosheet transistor stack and a nanosheet device stack on the substrate. The disclosed fabrication method also forms dielectric layers on peripheral sides of the nanosheet transistor stack which replace peripheral portions of each second nanosheet structure in the nanosheet transistor stack, thereby leaving remnant second nanosheet structures in the nanosheet transistor stack. In selected embodiments, the dielectric layers are formed on peripheral sides of the nanosheet transistor stack by partially recessing peripheral portions of the second nanosheet structures in the nanosheet transistor stack to form recess cavities in the nanosheet transistor stack; and then filling the recess cavities with dielectric material to form the dielectric layers on peripheral sides of the remnant second nanosheet structures in the nanosheet transistor stack. In addition, the disclosed fabrication method forms first electrodes from each first nanosheet structure on a first side of the nanosheet device stack by replacing a peripheral end portion of each first semiconductor layer on a second side of the nanosheet device stack with one or more first dielectric layers, thereby leaving remnant first semiconductor layers on the first side of the nanosheet device stack which form the first electrodes. In selected embodiments, the first electrodes may be formed by partially recessing the peripheral end portion of each first semiconductor layer on the second side of the nanosheet device stack to form a recess cavity on the second side of the nanosheet device stack; and filling each recess cavity with the one or more first dielectric layers to leave the remnant first semiconductor layers on the first side of the nanosheet device stack which form the first electrodes. The disclosed fabrication method also forms second electrodes from each second nanosheet structure on the second side of the nanosheet device stack by replacing a peripheral end portion of each tri-layer sandwich on the first side of the nanosheet device stack with one or more second dielectric layers to leave a remnant tri-layer sandwich on the second side of the nanosheet device stack and selectively removing top and bottom nanosheet layers from the remnant tri-layer sandwich, thereby leaving the middle nanosheet layers which form the second electrodes. In selected embodiments, the second electrodes may be formed by partially recessing the peripheral end portion of each tri-layer sandwich on the first side of the nanosheet device stack to form a recess cavity on the first side of the nanosheet device stack; filling the recess cavity with the one or more second dielectric layers to leave a remnant tri-layer sandwich on the second side of the nanosheet device stack; and selectively removing top and bottom nanosheet layers from the remnant tri-layer sandwich without removing the middle nanosheet layers to form the second electrodes. The disclosed fabrication method also forms gate electrodes which replace the remnant second nanosheet structures in the nanosheet transistor stack. In selected embodiments, the gate electrodes may be formed by selectively removing the remnant second nanosheet structures in the nanosheet transistor stack to form gate electrode openings before sequentially forming a gate dielectric layer and one or more conductive gate layers in the gate electrode openings to form the gate electrodes in the nanosheet transistor stack. As will be appreciated, the steps for forming the first and second electrodes may be interspersed with one another. For example, the second electrodes may be formed with a first set of processing steps which occur before forming first electrodes, and a second set of processing steps which occur after forming first electrodes.

In yet another form, there is provided a semiconductor device and associated method of fabrication. As disclosed, the semiconductor device includes a substrate, a first transistor stack formed on top of the substrate, and a device stack formed on top of the substrate. As formed the first transistor stack includes a first transistor channel region with at least first and second semiconductor layers separated from one another in a vertical dimension extending from the substrate, and a first control electrode stack at least partially surrounding the first and second semiconductor layers to control current flow through the first transistor channel region. In selected embodiments, the first control electrode stack includes an ALD metal gate layer formed on an ALD oxide layer. In addition, the device stack includes first electrodes formed with at least third and fourth semiconductor layers which extend from a first side of the device stack and which are separated from one another in the vertical dimension, and second electrodes formed with at least fifth and sixth semiconductor layers which extend from a second side of the device stack and which are separated from one another and from the third and fourth semiconductor layers in the vertical dimension. As formed, the first and third semiconductor layers are coplanar semiconductor layers formed over the substrate; the second and fourth semiconductor layers are coplanar semiconductor layers formed over the first and third semiconductor layers; and the fifth and sixth semiconductor layers are interleaved between and separated from the third and fourth semiconductor layers by gaps formed in the device stack. In selected embodiments, the first, second, third, and fourth semiconductor layers are each formed with a silicon nanosheet layer. In other embodiments, the fifth and sixth semiconductor layers are each formed with a silicon germanium nanosheet layer. As finally formed, the device stack may include a capacitor having a first capacitive electrode formed with the first electrodes, and a second capacitive electrode formed with the second electrodes and capacitively coupled to the first capacitive electrode. In other embodiments, the device stack may include a MEMS sensor having a first sensor electrode formed with the first electrodes, and a second sensor electrode formed with the second electrodes in the device stack.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted nanosheet transistor structures may be formed with different processing steps that can be combined and integrated with capacitor/sensor fabrication steps, and can utilize Si/SiGe superlattice structures having different numbers of SiGe and Si layers. Also, the various silicon-based constituent layers may be formed with different conductive materials than those disclosed. In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    providing a stack of alternating first and second semiconductor structures on a substrate, where each first semiconductor structure comprises a first semiconductor layer and where each second semiconductor structure comprises a tri-layer sandwich of top, middle and bottom nanosheet layers;
    selectively etching the stack of alternating first and second semiconductor structures to form a transistor stack and a device stack on the substrate; and
    processing the transistor stack and the device stack to form gate electrode structures between the first semiconductor structures in the transistor stack and to form first electrodes from the second semiconductor structures in the device stack, where forming first electrodes comprises:
    forming first device electrodes from each first semiconductor structure on a first side of the device stack by replacing a peripheral end portion of each first semiconductor layer on a second side of the device stack with one or more first dielectric layers, thereby leaving remnant first semiconductor layers on the first side of the device stack which form the first device electrodes; and
    forming second device electrodes from each second semiconductor structure on the second side of the device stack by replacing a peripheral end portion of each tri-layer sandwich on the first side of the device stack with one or more second dielectric layers to leave a remnant tri-layer sandwich on the second side of the device stack and selectively removing top and bottom nanosheet layers from the remnant tri-layer sandwich, thereby leaving the middle nanosheet layers which form the second device electrodes.

2. The method of claim 1, where each first semiconductor structure comprises a silicon nanosheet layer, and where each second semiconductor structure comprises a sandwiched stack of silicon germanium nanosheet layers comprising top and bottom SiGe nanosheet layers having different isotropic etch rates from a middle SiGe nanosheet layer.

3. The method of claim 1, where the first and second semiconductor structures are formed, respectively, with semiconductor materials having different isotropic etch rates from one another.

4. The method of claim 1, where the device stack comprises a capacitor comprising:
    a first capacitive electrode formed with the first electrodes, and
    a second capacitive electrode formed from the first semiconductor structures in the device stack and capacitively coupled to the first capacitive electrode.

5. The method of claim 1, where the device stack comprises a MEMS sensor comprising:
    a first sensor electrode formed with the first electrodes, and
    a second sensor electrode formed from the first semiconductor structures in the device stack.

6. A method for forming a semiconductor device comprising:
    providing a stack of alternating first and second nanosheet structures on a substrate, where each first nanosheet structure comprises a first semiconductor layer and where each second nanosheet structure comprises a tri-layer sandwich of top, middle and bottom nanosheet layers;
    selectively etching the stack of alternating first and second nanosheet structures to form a nanosheet transistor stack and a nanosheet device stack on the substrate;
    forming dielectric layers on peripheral sides of the nanosheet transistor stack which replace peripheral portions of each second nanosheet structure in the nanosheet transistor stack, thereby leaving remnant second nanosheet structures in the nanosheet transistor stack;
    forming first electrodes from each first nanosheet structure on a first side of the nanosheet device stack by replacing a peripheral end portion of each first semiconductor layer on a second side of the nanosheet device stack with one or more first dielectric layers, thereby leaving remnant first semiconductor layers on the first side of the nanosheet device stack which form the first electrodes;
    forming second electrodes from each second nanosheet structure on the second side of the nanosheet device stack by replacing a peripheral end portion of each tri-layer sandwich on the first side of the nanosheet device stack with one or more second dielectric layers to leave a remnant tri-layer sandwich on the second side of the nanosheet device stack and selectively removing top and bottom nanosheet layers from the remnant tri-layer sandwich, thereby leaving the middle nanosheet layers which form the second electrodes; and
    forming gate electrode structures which replace the remnant second nanosheet structures in the nanosheet transistor stack.

7. The method of claim 6, where the first semiconductor layer comprises a silicon layer, and where the tri-layer sandwich comprises a top nanosheet layer of silicon germanium, a middle nanosheet layer of silicon germanium, and a bottom nanosheet layer of silicon germanium, where the top and bottom nanosheet layers of silicon germanium have different isotropic etch rates from the middle nanosheet layer of silicon germanium.

8. The method of claim 6, where providing the stack of alternating first and second nanosheet structures comprises epitaxially growing the first nanosheet structure and the second nanosheet structure over the substrate.

9. The method of claim 6, where forming dielectric layers on peripheral sides of the nanosheet transistor stack comprises:

partially recessing peripheral portions of the second nanosheet structures in the nanosheet transistor stack to form recess cavities in the nanosheet transistor stack; and filling the recess cavities with dielectric material to form the dielectric layers on peripheral sides of the remnant second nanosheet structures in the nanosheet transistor stack.

10. The method of claim 9, where forming gate electrode structures comprises selectively removing the remnant second nanosheet structures in the nanosheet transistor stack to form gate electrode openings before sequentially forming a gate dielectric layer and one or more conductive gate layers in the gate electrode openings to form the gate electrode structures in the nanosheet transistor stack.

11. The method of claim 6, where forming first electrodes from each first nanosheet structure on a first side of the nanosheet device stack comprises:

partially recessing the peripheral end portion of each first semiconductor layer on the second side of the nanosheet device stack to form a recess cavity on the second side of the nanosheet device stack; and filling each recess cavity with the one or more first dielectric layers to leave the remnant first semiconductor layers on the first side of the nanosheet device stack which form the first electrodes.

12. The method of claim 6, where forming second electrodes from each second nanosheet structure on the second side of the nanosheet device stack comprises:

partially recessing the peripheral end portion of each tri-layer sandwich on the first side of the nanosheet device stack to form a recess cavity on the first side of the nanosheet device stack;

filling the recess cavity with the one or more second dielectric layers to leave a remnant tri-layer sandwich on the second side of the nanosheet device stack; and selectively removing top and bottom nanosheet layers from the remnant tri-layer sandwich without removing the middle nanosheet layers to form the second electrodes.

13. The method of claim 6, where forming second electrodes comprises a first set of processing steps which occur before forming first electrodes, and a second set of processing steps which occur after forming first electrodes.

* * * * *